United States Patent
Embleton et al.

(10) Patent No.: US 11,234,347 B2
(45) Date of Patent: Jan. 25, 2022

(54) SYSTEM AND METHOD FOR PHYSICAL MANAGEMENT OF DEVICES

(71) Applicant: Dell Products L.P., Hopkinton, MA (US)

(72) Inventors: Steven Embleton, Austin, TX (US); Ben John Sy, Austin, TX (US); Eric Michael Tunks, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/516,364

(22) Filed: Jul. 19, 2019

(65) Prior Publication Data

US 2021/0022270 A1 Jan. 21, 2021

(51) Int. Cl.
  *H05K 7/20* (2006.01)
  *H05K 7/14* (2006.01)
  *H05K 7/18* (2006.01)

(52) U.S. Cl.
  CPC ....... *H05K 7/20836* (2013.01); *H05K 7/1489* (2013.01); *H05K 7/1492* (2013.01); *H05K 7/1494* (2013.01); *H05K 7/183* (2013.01)

(58) Field of Classification Search
  None
  See application file for complete search history.

(56) References Cited

U.S. PATENT DOCUMENTS

| | | | |
|---|---|---|---|
| 4,785,136 A | 11/1988 | Mollet et al. | |
| 4,858,309 A * | 8/1989 | Korsunsky | H01R 12/7005 29/764 |
| 4,871,220 A | 10/1989 | Kohin | |
| 5,049,701 A | 9/1991 | Vowles et al. | |
| 5,084,802 A | 1/1992 | Nguyenngoc | |
| 5,250,752 A | 10/1993 | Cutright | |
| 5,294,748 A | 3/1994 | Schwenk et al. | |
| 5,323,298 A | 6/1994 | Shatas et al. | |
| 5,437,560 A * | 8/1995 | Mizuguchi | H05K 7/1431 439/326 |
| 5,545,844 A | 8/1996 | Plummer, III et al. | |
| 5,545,845 A | 8/1996 | Flores | |
| 5,649,831 A * | 7/1997 | Townsend | H05K 7/1409 439/157 |
| 5,762,513 A * | 6/1998 | Stine | H01R 13/6273 439/358 |
| 5,812,370 A * | 9/1998 | Moore | G11B 33/121 361/679.35 |
| 5,943,218 A * | 8/1999 | Liu | H05K 7/1405 361/679.32 |
| 6,011,221 A | 1/2000 | Lecinski et al. | |

(Continued)

OTHER PUBLICATIONS

"Full HD Endoscopes"; joimax® GmbH, May 1, 2019; https://web.archive.org/web/20190501003355/https://www.joimax.com/en/products/electronic-devices/hd_endoscopes/.

(Continued)

*Primary Examiner* — Xanthia C Cunningham
(74) *Attorney, Agent, or Firm* — Chamberlain, Hrdlicka, White, Williams & Aughtry

(57) ABSTRACT

A constrainer includes a base and two arms mechanically coupled to the base. The base and two arms receive a device while the constrainer is in a first state and, while the constrainer is transitioning from the first state to a second state and while the device is disposed in the constrainer, place the device in a predetermined orientation.

20 Claims, 15 Drawing Sheets

(56) References Cited

U.S. PATENT DOCUMENTS

| | | | |
|---|---|---|---|
| 6,038,130 A * | 3/2000 | Boeck | H01R 9/2675 361/735 |
| 6,045,385 A * | 4/2000 | Kane | G06F 1/183 439/327 |
| 6,068,009 A | 5/2000 | Paes et al. | |
| 6,176,727 B1 * | 1/2001 | Liu | H01R 12/7005 439/327 |
| 6,208,514 B1 * | 3/2001 | Stark | H05K 7/1431 174/359 |
| 6,225,554 B1 | 5/2001 | Trehan et al. | |
| 6,242,690 B1 | 6/2001 | Glover | |
| 6,269,001 B1 * | 7/2001 | Matteson | H01L 23/4093 165/80.3 |
| 6,331,940 B1 * | 12/2001 | Lin | H05K 7/1431 361/785 |
| 6,332,792 B1 * | 12/2001 | Lin | H05K 7/1431 439/160 |
| 6,370,036 B1 * | 4/2002 | Boe | H05K 7/1431 24/563 |
| 6,377,451 B1 * | 4/2002 | Furuya | G06F 1/1616 360/99.02 |
| 6,437,987 B1 * | 8/2002 | Lin | H05K 7/1431 29/832 |
| 6,517,369 B1 * | 2/2003 | Butterbaugh | H01R 12/707 439/327 |
| 6,552,915 B2 | 4/2003 | Takahashi et al. | |
| 6,613,977 B1 | 9/2003 | Fowler | |
| 6,657,214 B1 | 12/2003 | Foegelle et al. | |
| 6,695,630 B1 * | 2/2004 | Ku | H05K 7/1431 439/152 |
| 6,870,092 B2 | 3/2005 | Lambert et al. | |
| 6,947,290 B2 * | 9/2005 | Hirata | G06K 7/0013 361/741 |
| 7,035,087 B2 | 4/2006 | Tan | |
| 7,075,796 B1 * | 7/2006 | Pritchett | G06F 1/184 211/41.17 |
| 7,133,296 B2 * | 11/2006 | Choi | H01R 13/641 361/798 |
| 7,287,996 B1 * | 10/2007 | Shing | H05K 7/1431 439/327 |
| 7,371,097 B1 * | 5/2008 | Pennypacker | H01R 13/6275 439/327 |
| 7,371,977 B1 | 5/2008 | Preonas | |
| 7,692,934 B2 * | 4/2010 | Bartscher | H05K 13/0069 361/825 |
| 7,695,313 B2 * | 4/2010 | Karim | H02B 1/052 439/540.1 |
| 7,757,847 B2 * | 7/2010 | Tang | A45C 11/18 206/307.1 |
| 8,059,414 B2 * | 11/2011 | Wei | A45C 11/18 361/737 |
| 8,098,492 B2 * | 1/2012 | Rosenberg | H05K 7/1492 361/736 |
| 8,243,469 B2 | 8/2012 | Jaze et al. | |
| 8,310,834 B2 * | 11/2012 | Furholzer | H02B 1/052 361/747 |
| 8,363,526 B2 | 1/2013 | Hotta et al. | |
| 8,508,956 B2 | 8/2013 | Nicol | |
| 8,530,756 B1 | 9/2013 | Winch | |
| 8,636,526 B2 * | 1/2014 | Funamura | H01R 13/64 439/137 |
| 8,642,900 B2 | 2/2014 | Nordling et al. | |
| 8,662,295 B2 * | 3/2014 | Kubota | B65D 25/10 206/307 |
| 8,687,374 B2 * | 4/2014 | Watanabe | H05K 5/0052 361/752 |
| 8,720,682 B2 * | 5/2014 | Navon | A45C 11/18 206/320 |
| 8,760,859 B2 | 6/2014 | Fuchs et al. | |
| 8,969,738 B2 | 3/2015 | Ross | |
| 9,019,711 B2 * | 4/2015 | Tamura | H05K 7/1418 361/752 |
| 9,095,045 B2 | 7/2015 | Rojo et al. | |
| 9,370,132 B2 | 6/2016 | Coppola | |
| 9,497,894 B1 | 11/2016 | Ramsey | |
| 9,549,480 B1 | 1/2017 | Besterman | |
| 9,585,270 B2 * | 2/2017 | Yang | G06F 1/18 |
| 9,603,280 B2 | 3/2017 | Frank et al. | |
| 9,607,660 B2 * | 3/2017 | Bennett, II | G11B 33/00 |
| 9,640,910 B1 * | 5/2017 | Chien | G06F 13/409 |
| 9,642,290 B2 | 5/2017 | Anderson et al. | |
| 9,820,404 B1 * | 11/2017 | Wu | G06F 1/16 |
| 9,829,939 B1 * | 11/2017 | Lien | G11B 33/124 |
| 9,930,816 B2 | 3/2018 | Winch et al. | |
| 10,007,309 B1 | 6/2018 | Imwalle | |
| 10,249,984 B1 * | 4/2019 | Rask | H01R 13/562 |
| 10,364,031 B2 * | 7/2019 | Goupil | F16M 11/041 |
| 10,420,258 B1 | 9/2019 | Rahilly et al. | |
| 10,477,740 B2 | 11/2019 | Coppola | |
| 10,477,741 B1 | 11/2019 | Bae et al. | |
| 10,492,324 B2 * | 11/2019 | Miura | H05K 7/1427 |
| 10,520,532 B2 | 12/2019 | Lee | |
| 10,541,519 B1 * | 1/2020 | Wavering | H02B 1/044 |
| 10,542,642 B2 | 1/2020 | Babhadiashar et al. | |
| 10,575,443 B2 | 2/2020 | Woodbury, II et al. | |
| 10,638,634 B1 | 4/2020 | Elsasser | |
| 10,707,636 B2 * | 7/2020 | Yamamoto | H05K 3/366 |
| 10,720,722 B2 * | 7/2020 | Tsorng | H01R 12/716 |
| 10,734,763 B2 * | 8/2020 | M R | H01R 13/639 |
| 10,980,159 B2 | 4/2021 | Embleton et al. | |
| 2002/0000645 A1 * | 1/2002 | Sato | H01R 12/82 257/666 |
| 2002/0001181 A1 * | 1/2002 | Kondo | G06K 7/0047 361/728 |
| 2002/0027769 A1 * | 3/2002 | Kasahara | G06F 1/1616 361/679.31 |
| 2002/0064035 A1 | 5/2002 | Mair et al. | |
| 2003/0011988 A1 | 1/2003 | Irmer | |
| 2003/0057131 A1 | 3/2003 | Diaferia | |
| 2003/0137811 A1 * | 7/2003 | Ling | H05K 7/1431 361/759 |
| 2003/0174474 A1 | 9/2003 | Mair | |
| 2003/0174487 A1 | 9/2003 | Garmong | |
| 2005/0247471 A1 | 11/2005 | Archambeault | |
| 2006/0025010 A1 * | 2/2006 | Spitaels | H04Q 1/021 439/532 |
| 2007/0105445 A1 | 5/2007 | Manto et al. | |
| 2007/0145699 A1 | 6/2007 | Robbins | |
| 2007/0147013 A1 | 6/2007 | Robbins | |
| 2007/0151779 A1 | 7/2007 | Robbins | |
| 2008/0076291 A1 * | 3/2008 | Ewing | H01R 13/621 439/373 |
| 2009/0021925 A1 | 1/2009 | Heimann | |
| 2009/0095523 A1 | 4/2009 | Stevenson | |
| 2009/0146862 A1 | 6/2009 | Malone | |
| 2010/0117579 A1 | 5/2010 | Culbert | |
| 2010/0208433 A1 | 8/2010 | Heimann | |
| 2010/0270299 A1 | 10/2010 | Baltussen | |
| 2010/0285636 A1 | 11/2010 | Chen | |
| 2010/0319981 A1 | 12/2010 | Kapusta et al. | |
| 2011/0011760 A1 | 1/2011 | Habersetzer | |
| 2011/0198245 A1 | 8/2011 | Soufan | |
| 2011/0222249 A1 | 9/2011 | Ruehl et al. | |
| 2011/0232956 A1 | 9/2011 | Ramsey | |
| 2012/0011700 A1 * | 1/2012 | Kelaher | H05K 7/1461 29/464 |
| 2012/0044653 A1 | 2/2012 | Morris et al. | |
| 2012/0073873 A1 | 3/2012 | Nash | |
| 2012/0116590 A1 | 5/2012 | Florez-Iarrahondo | |
| 2012/0178364 A1 | 7/2012 | Dobyns | |
| 2012/0285738 A1 * | 11/2012 | Cochrane | H05K 9/0041 174/382 |
| 2013/0032310 A1 | 2/2013 | Jaena et al. | |
| 2013/0160563 A1 * | 6/2013 | Dingler | G01B 7/16 73/855 |
| 2013/0194772 A1 | 8/2013 | Rojo | |
| 2013/0206470 A1 | 8/2013 | Davis | |
| 2013/0258582 A1 | 10/2013 | Shelnutt et al. | |
| 2013/0277520 A1 * | 10/2013 | Funk | G06F 1/1626 248/274.1 |

(56) References Cited

U.S. PATENT DOCUMENTS

| | | | |
|---|---|---|---|
| 2014/0008119 A1 | 1/2014 | Brandt | |
| 2014/0138388 A1 | 5/2014 | Synnestvedt | |
| 2014/0368821 A1 | 12/2014 | Gazaway et al. | |
| 2015/0014912 A1* | 1/2015 | Ivey | H05K 7/1415 269/309 |
| 2015/0245529 A1* | 8/2015 | Tam | H01R 12/737 29/739 |
| 2015/0257310 A1 | 9/2015 | Desouza | |
| 2015/0271959 A1 | 9/2015 | Chen et al. | |
| 2015/0368423 A1 | 12/2015 | Yamauchi et al. | |
| 2015/0373869 A1 | 12/2015 | Macerini et al. | |
| 2016/0081231 A1 | 3/2016 | Berke | |
| 2016/0111814 A1* | 4/2016 | Hirano | G11B 33/122 361/679.33 |
| 2016/0159480 A1* | 6/2016 | Barth | F16M 13/022 248/218.4 |
| 2016/0182130 A1 | 6/2016 | Ahmed et al. | |
| 2016/0372948 A1 | 12/2016 | Kvols | |
| 2016/0381818 A1 | 12/2016 | Mills et al. | |
| 2017/0347496 A1 | 11/2017 | Smith | |
| 2018/0062287 A1* | 3/2018 | Shaw | H01R 12/7029 |
| 2018/0257334 A1 | 9/2018 | Motoyanagi et al. | |
| 2019/0008079 A1 | 1/2019 | Kondo et al. | |
| 2019/0050030 A1 | 2/2019 | Baum | |
| 2019/0056439 A1 | 2/2019 | Lee | |
| 2019/0159371 A1 | 5/2019 | Grinsteinner | |
| 2019/0230828 A1 | 7/2019 | Murch | |
| 2019/0304922 A1 | 10/2019 | Maruthamuthu et al. | |
| 2019/0320796 A1 | 10/2019 | Ding | |
| 2019/0353356 A1 | 11/2019 | Fischer | |
| 2019/0364701 A1 | 11/2019 | Rahilly et al. | |
| 2019/0379183 A1 | 12/2019 | Winsor | |
| 2020/0187394 A1 | 6/2020 | Murugesan | |
| 2020/0187578 A1 | 6/2020 | Sadato | |
| 2020/0313584 A1 | 10/2020 | Morel et al. | |

OTHER PUBLICATIONS

"JRE 0814 RF Shielded Test Enclosure"; JRE Test, LLC, Apr. 22, 2019; https://web.archive.org/web/20190422094016/https://jretest.com/product/jre-0814/.

"Tapster"; Tapster Robotics, Inc., Sep. 30, 2017; https://web.archive.org/web/20170930111059/https://www.tapster.io/.

Gary Fenical; "Rule-of-Thumb for Calculating Aperture Size"; Laird Technologies; Mar. 2003 (http://cdn.lairdtech.com/home/brandworld/files/EMI%20Rule-of-Thumb%20for%20Calculating%20Aperture%20Size%20Technical%20Note%20Download.pdf).

* cited by examiner

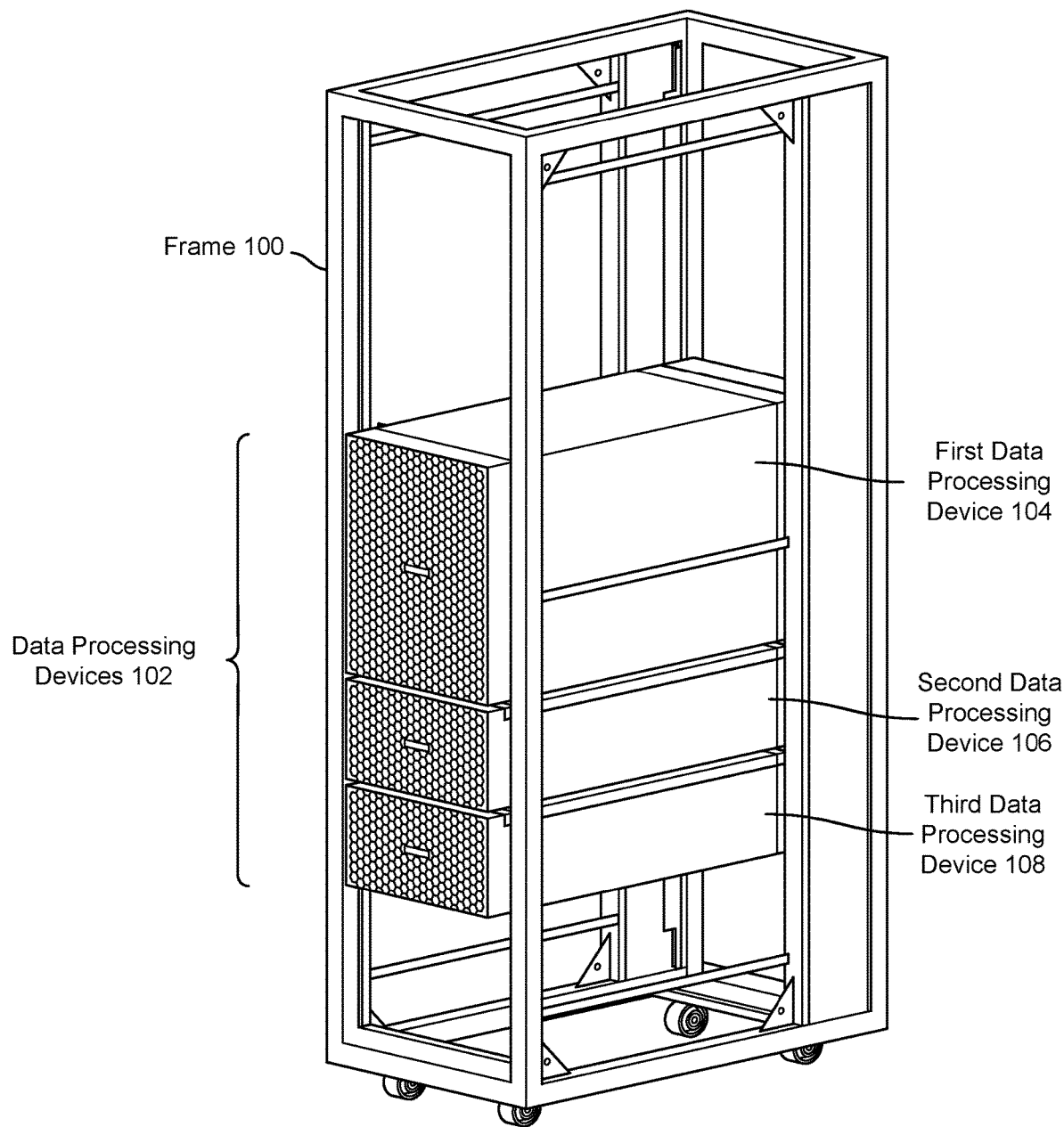
FIG. 1.1

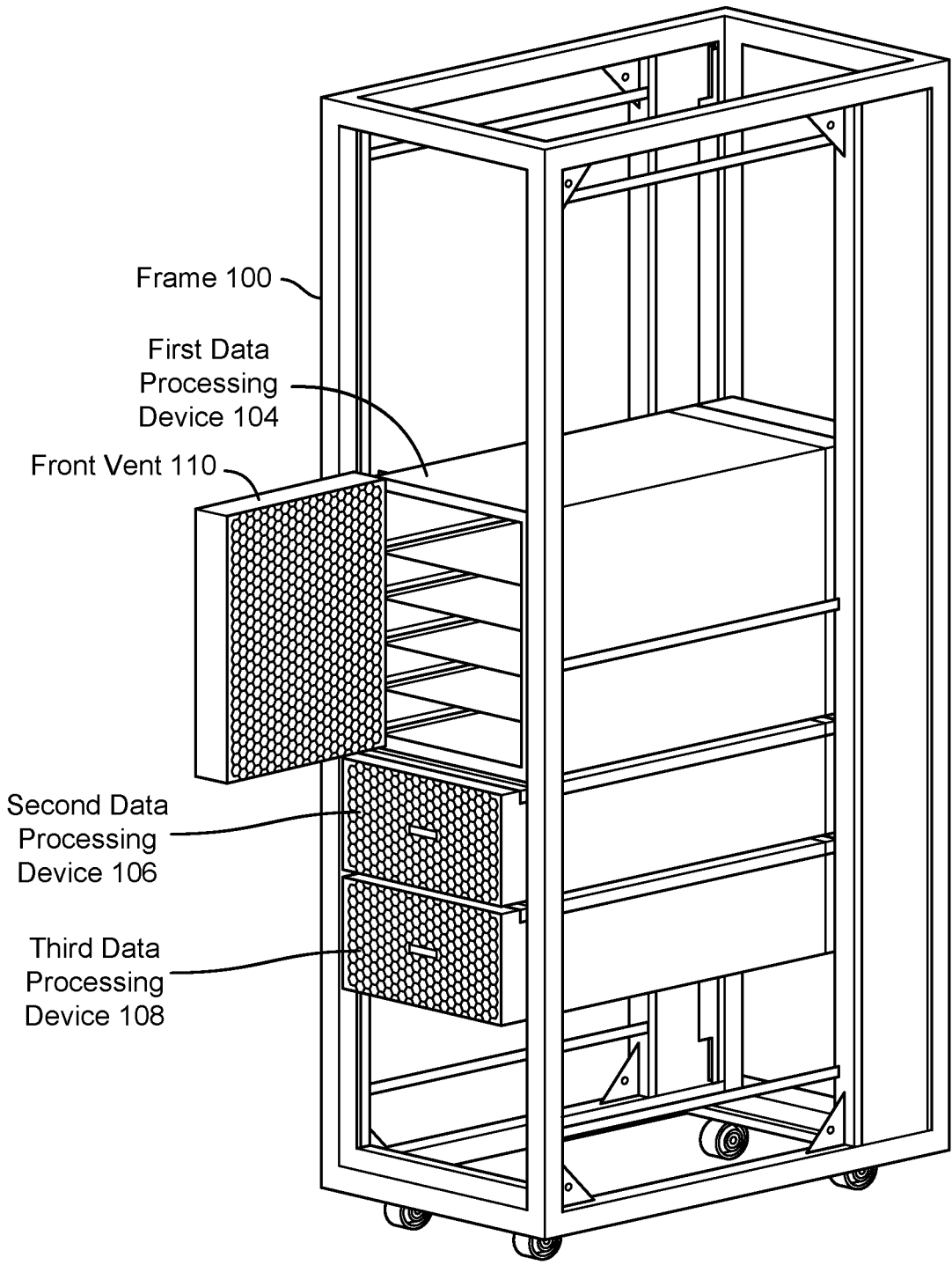
FIG. 1.2

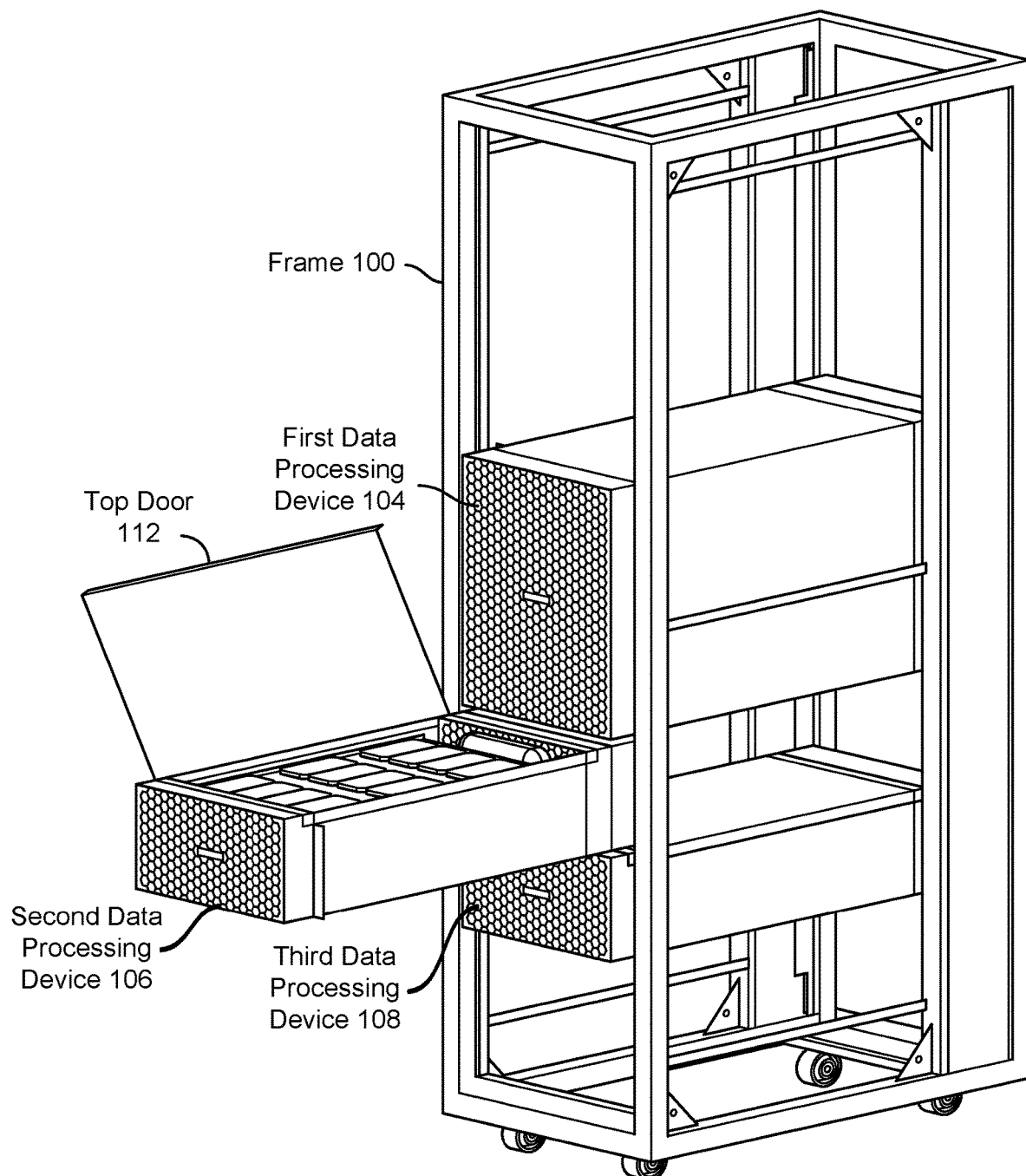
FIG. 1.3

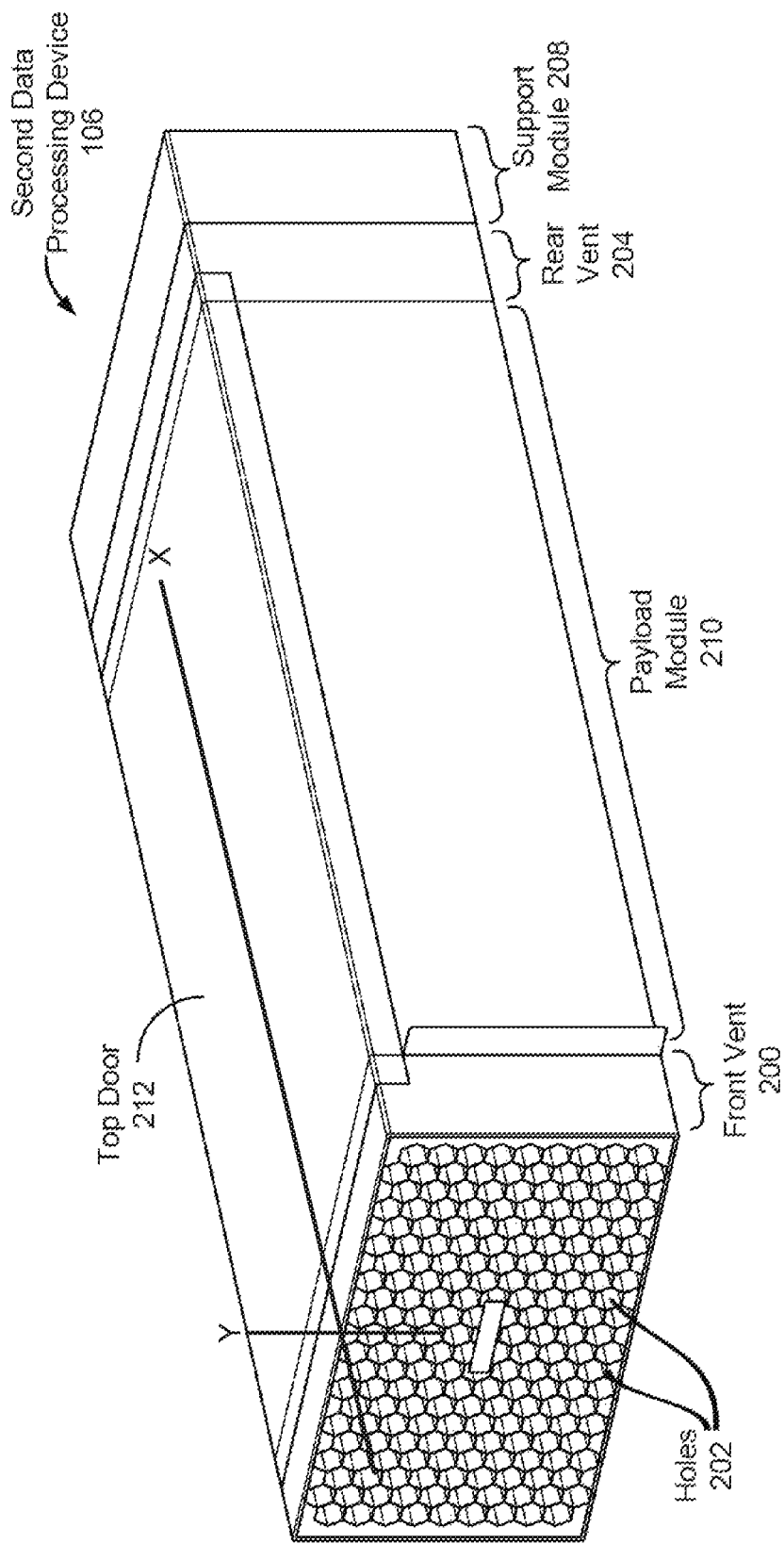
FIG. 2.1

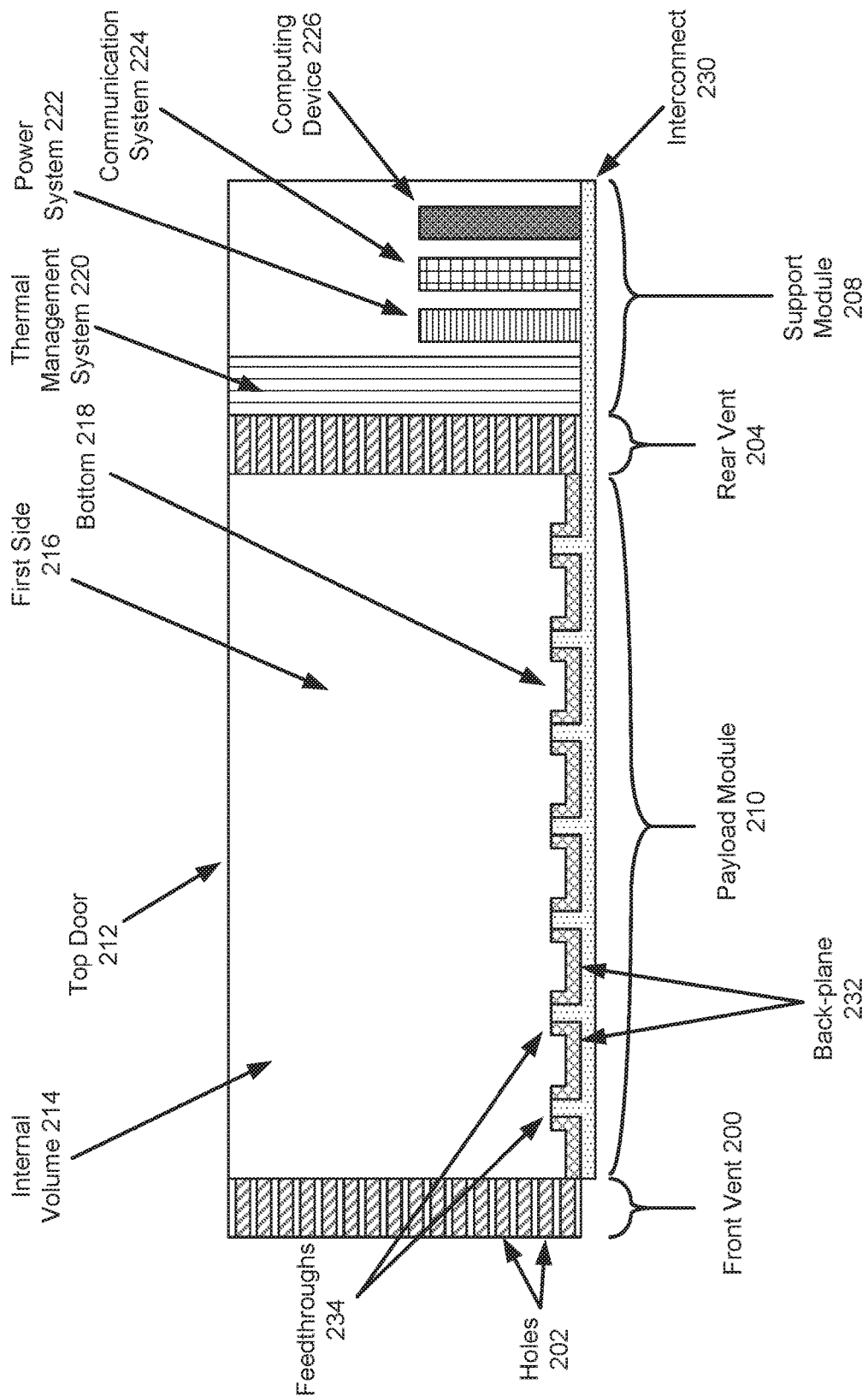
FIG. 2.2

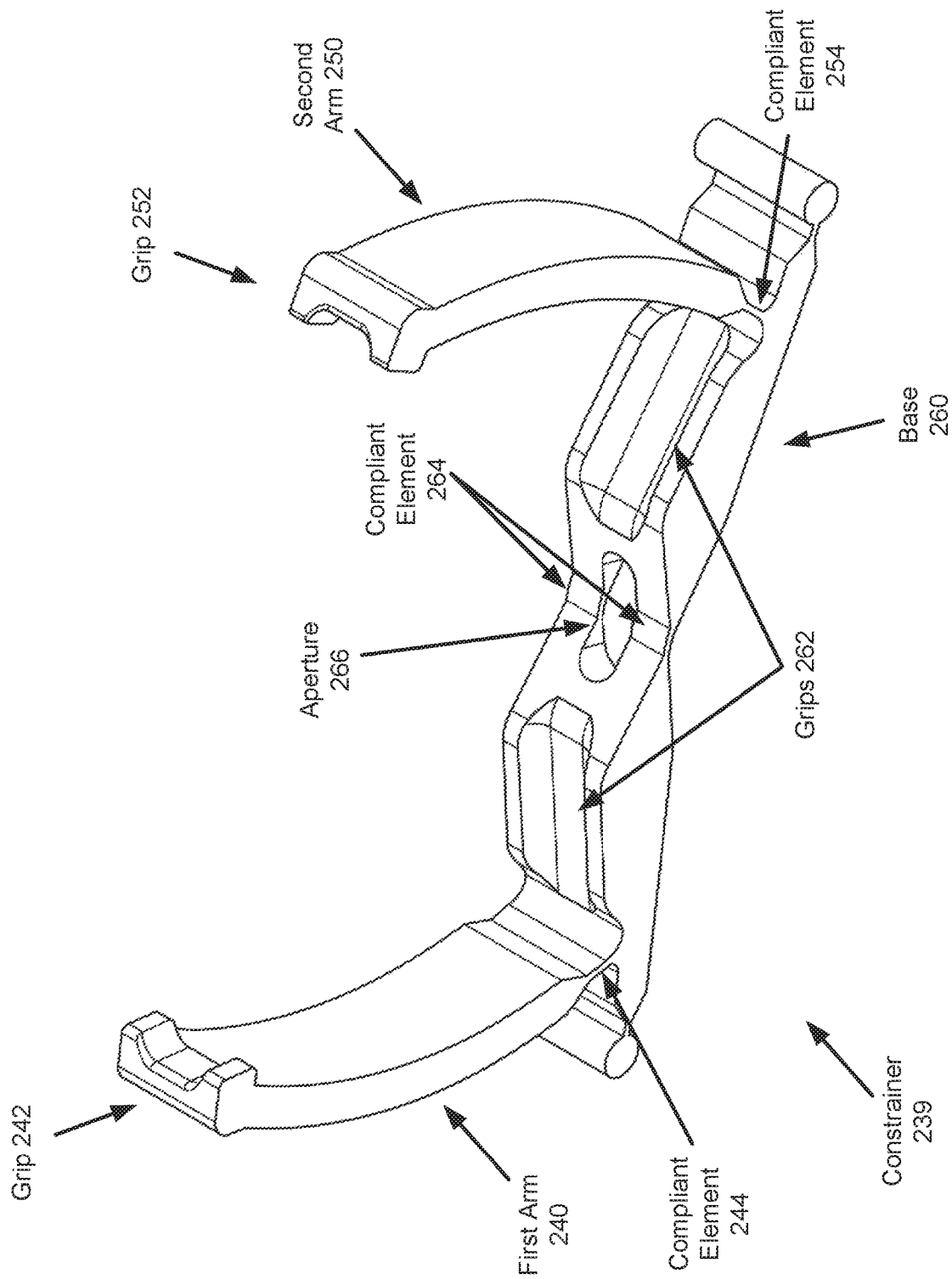
FIG. 2.3

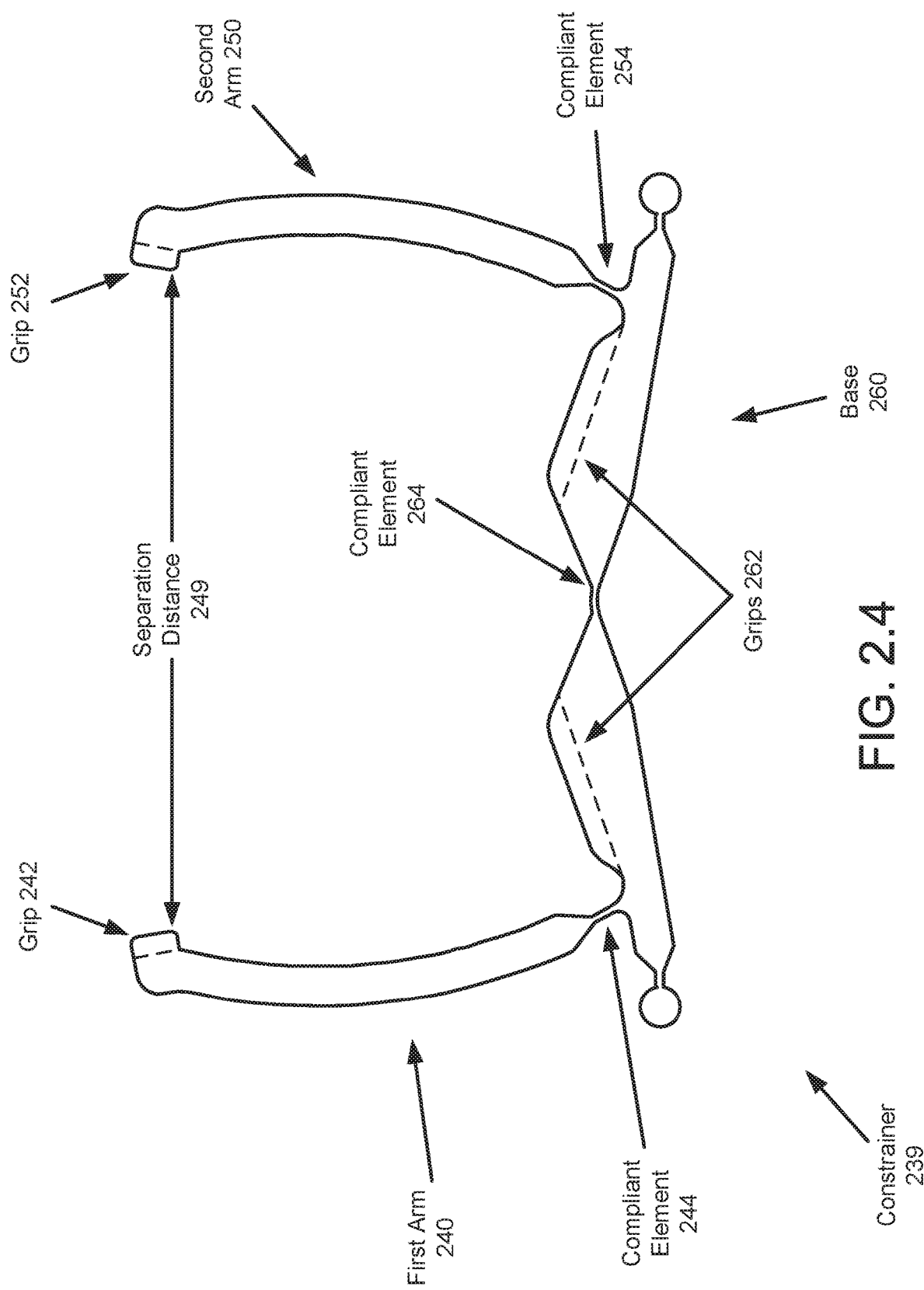
FIG. 2.4

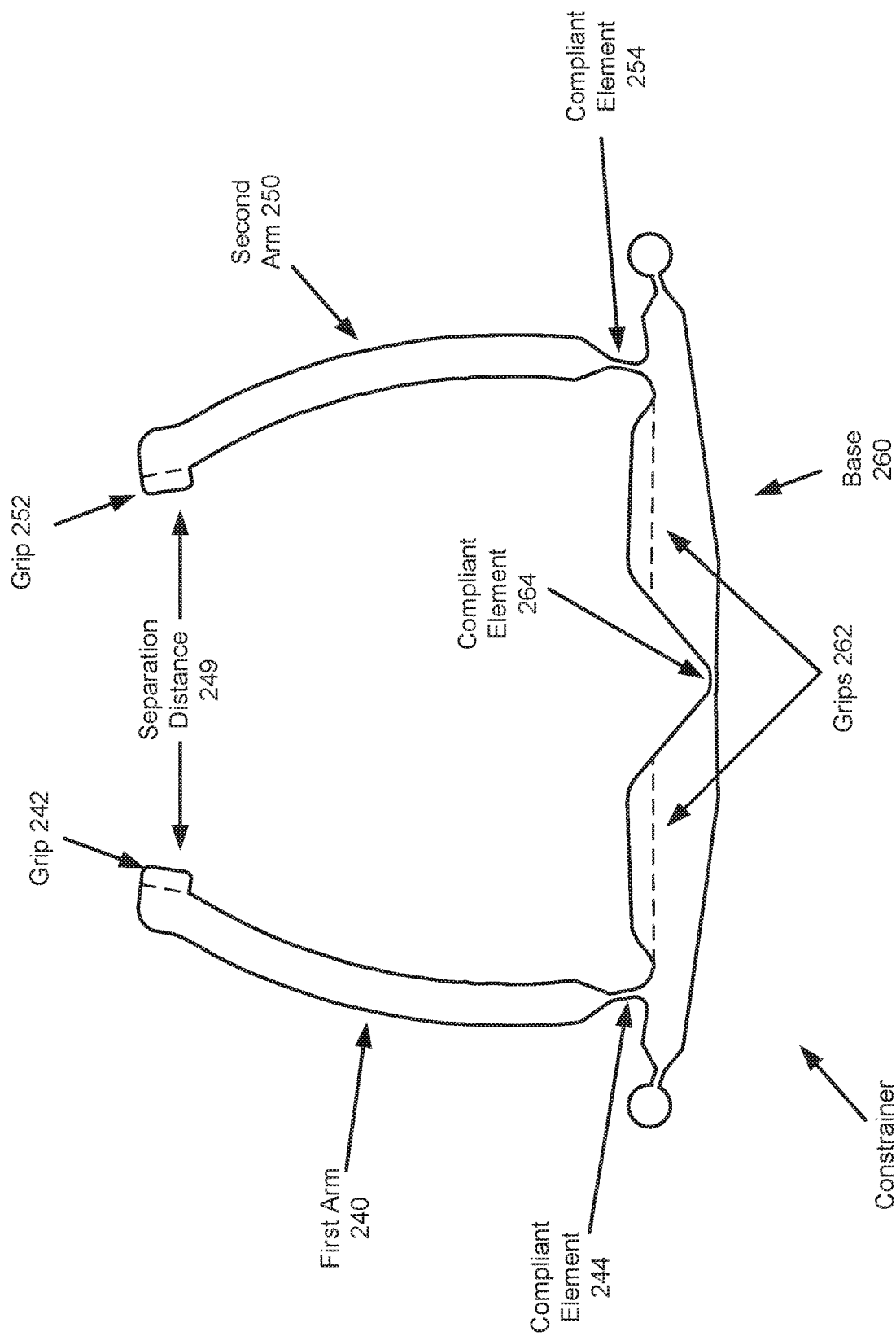
FIG. 2.5

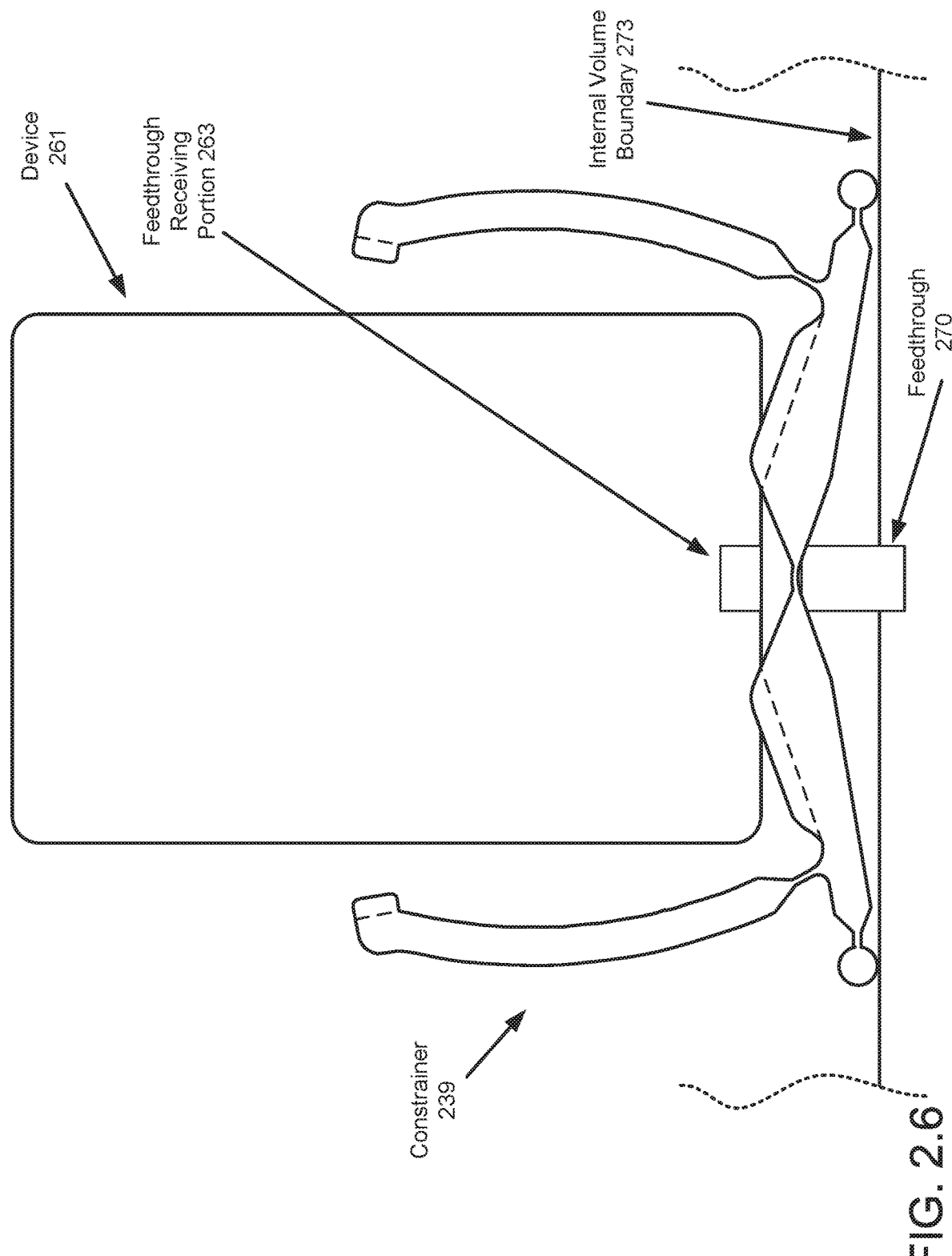
FIG. 2.6

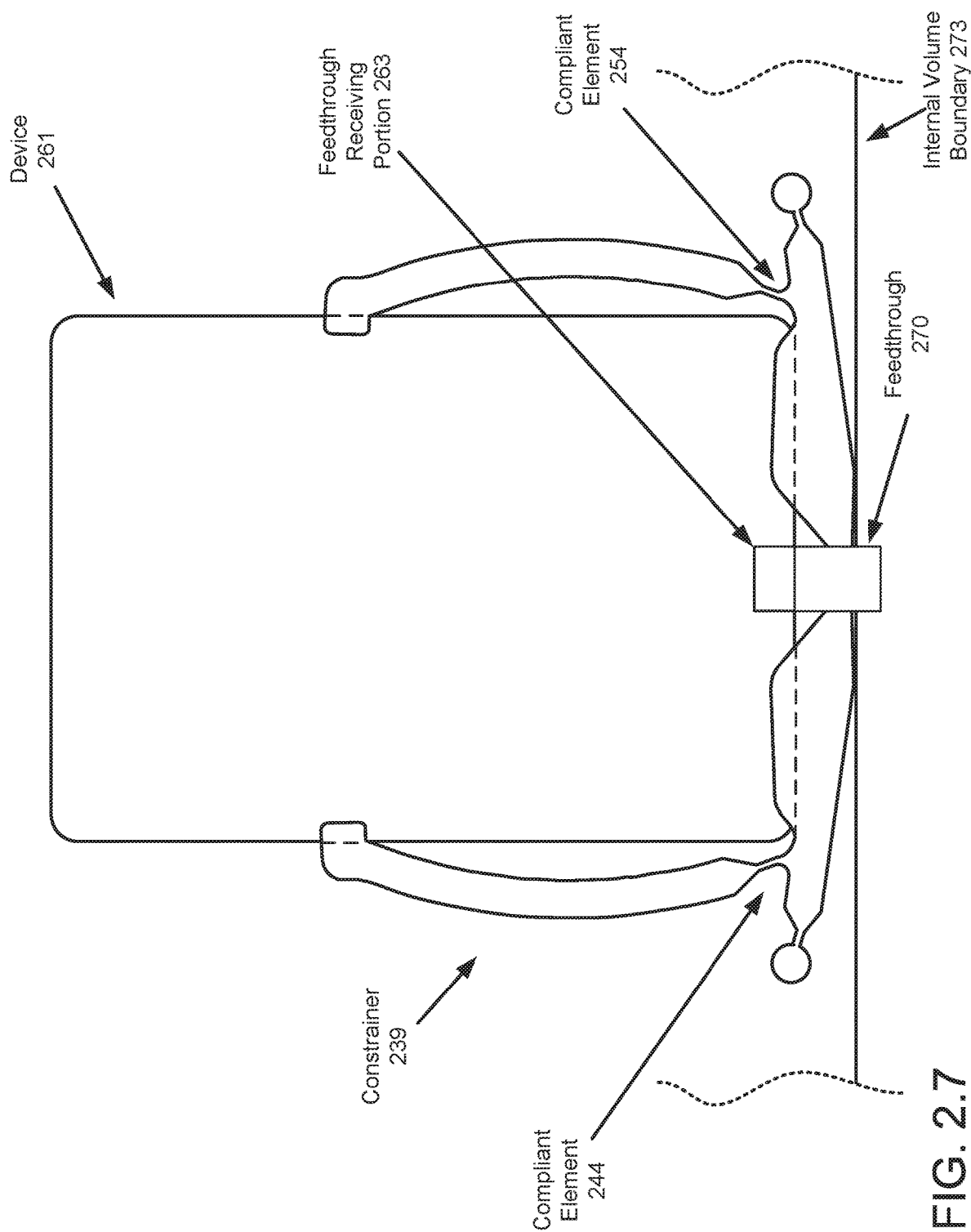
FIG. 2.7

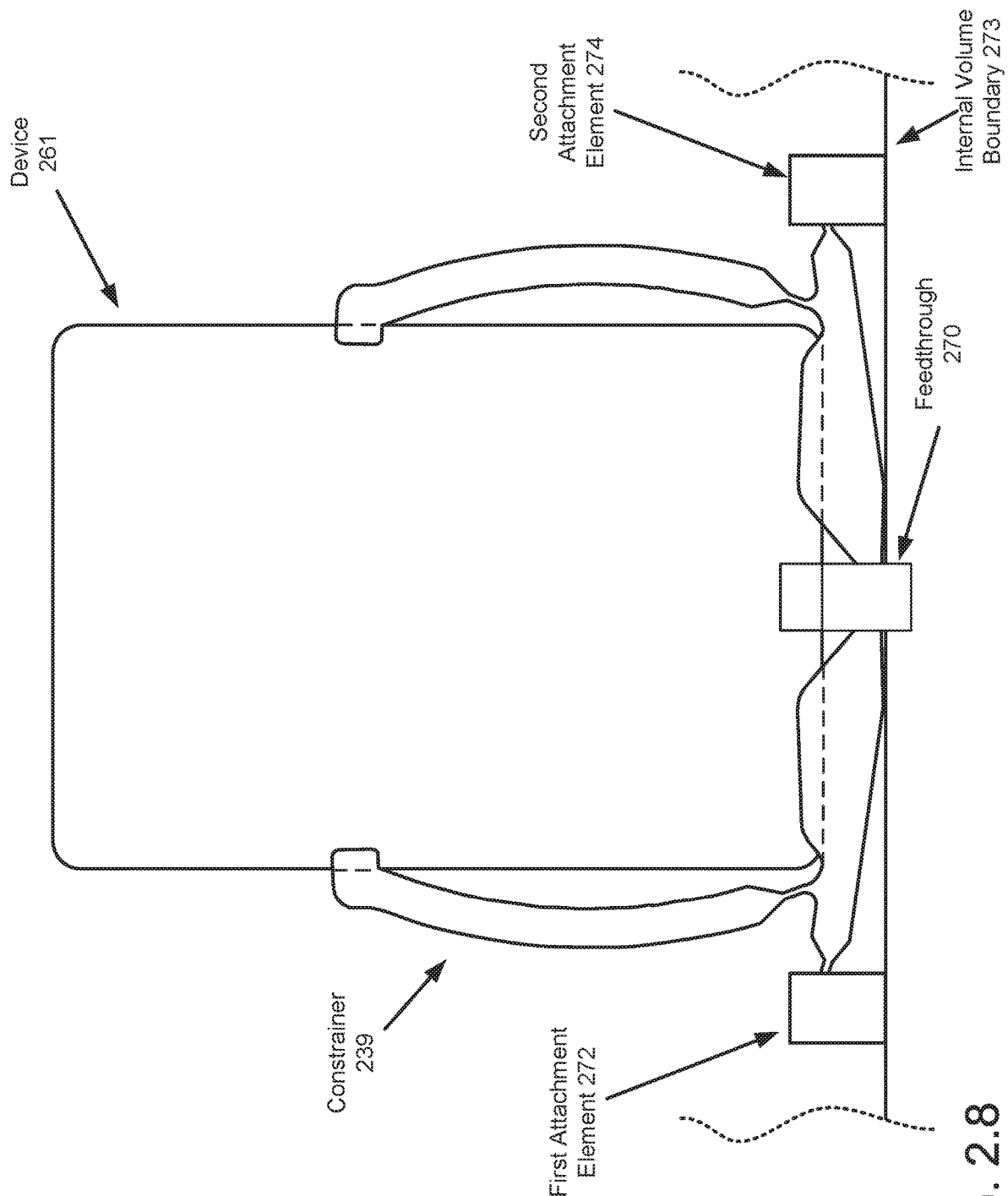
FIG. 2.8

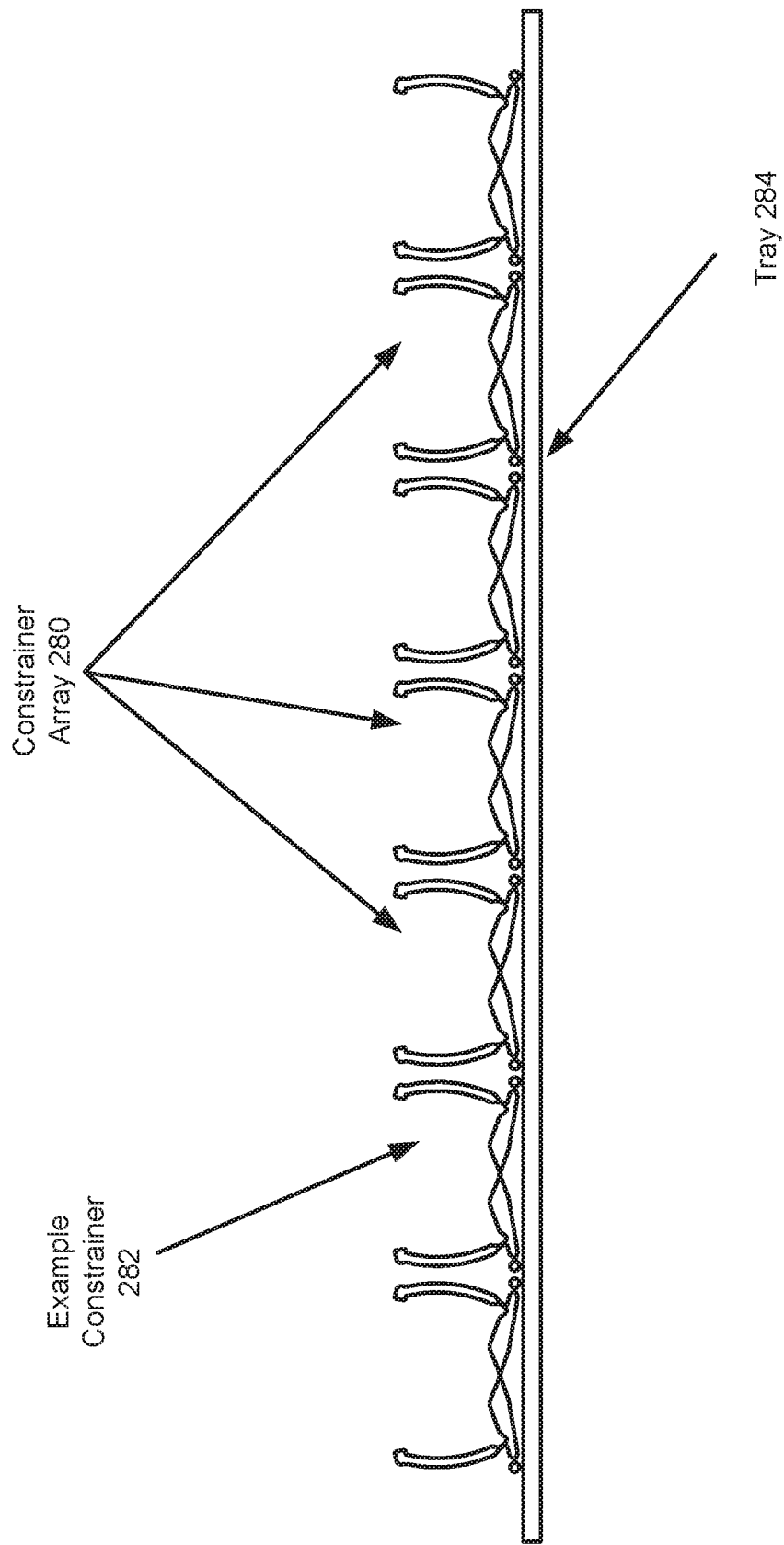
FIG. 2.9

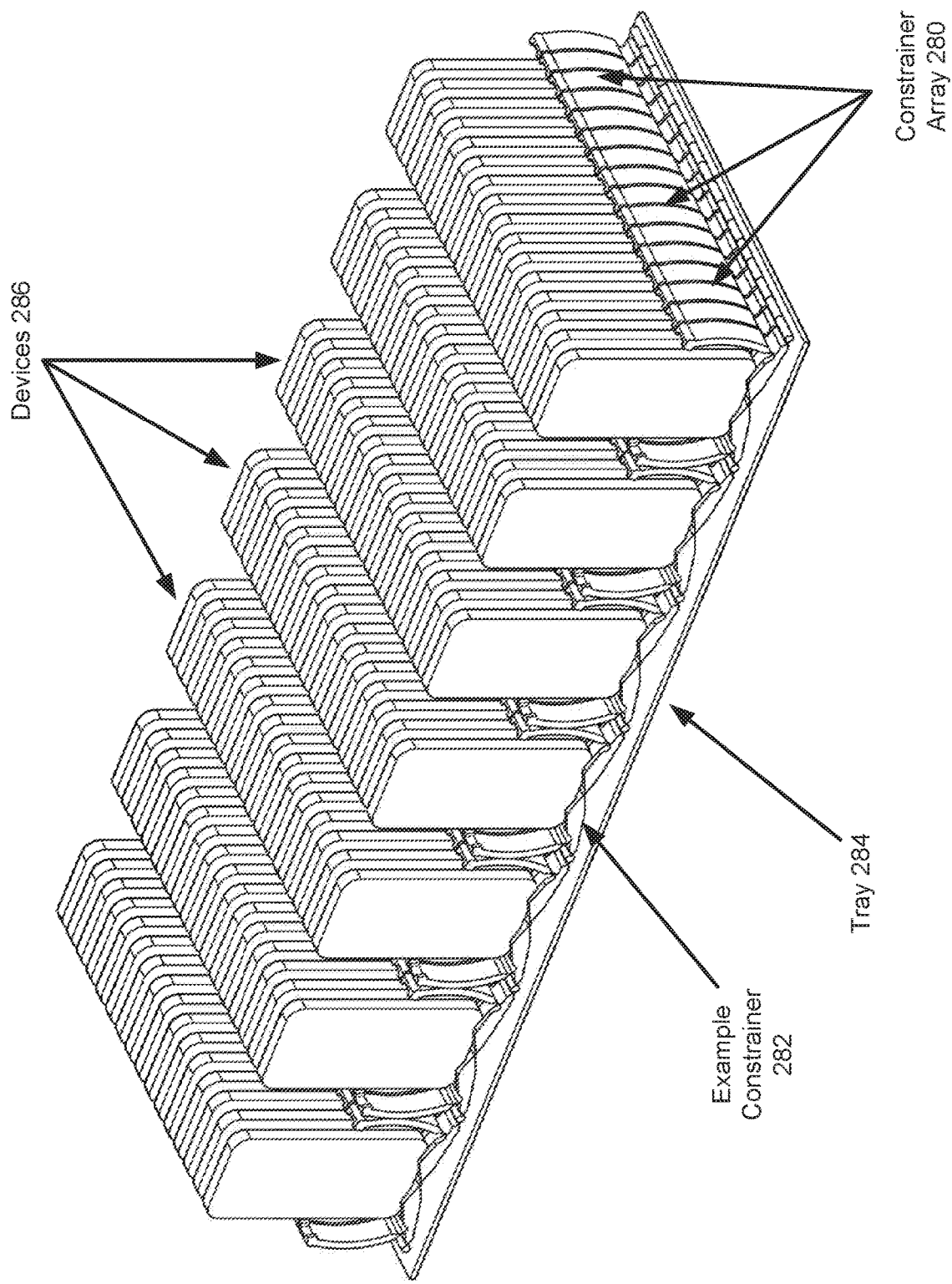
FIG. 2.10

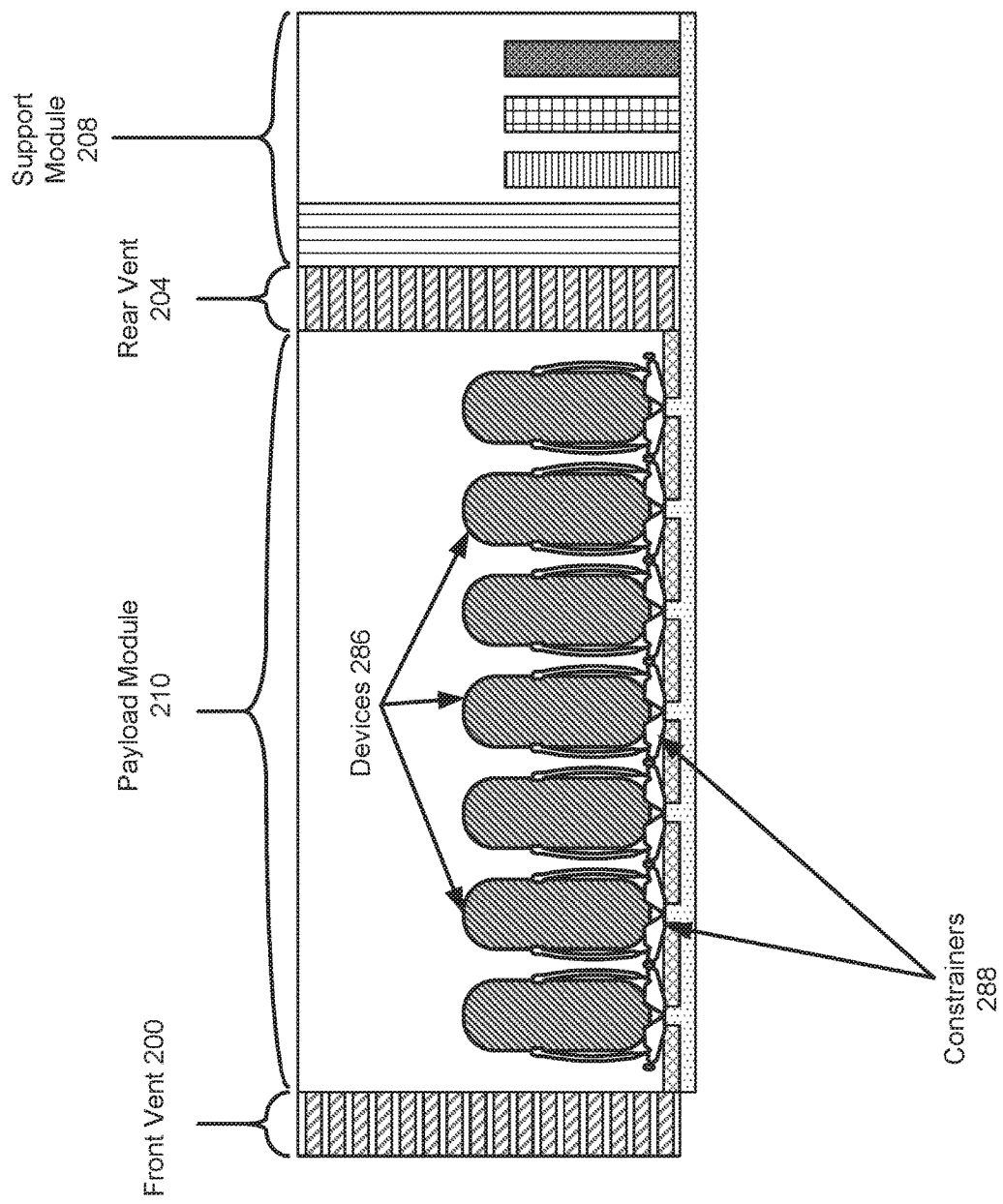
FIG. 2.11

SYSTEM AND METHOD FOR PHYSICAL MANAGEMENT OF DEVICES

BACKGROUND

High density environment may include devices that are tightly packed together. In other words, the devices may be physically close to each other. Such an environment presents numerous challenges relating to thermal management, mechanical positioning and orienting of devices, and electrical concerns related to power and operation of such devices.

SUMMARY

In one aspect, a constrainer in accordance with one or more embodiments of the invention includes a base and two arms mechanically coupled to the base. The base and two arms receive a device while the constrainer is in a first state and, while the constrainer is transitioning from the first state to a second state and while the device is disposed in the constrainer, place the device in a predetermined orientation.

In one aspect, a data processing device in accordance with one or more embodiments of the invention includes an internal volume that houses a device; a feedthrough disposed at least partially in the internal volume, the feedthrough is operably connects the device to other devices disposed outside of the internal volume; and a constrainer that places the device in a predetermined orientation with respect to the feedthrough while the constrainer is moved from a first position that separates the device from the feedthrough to a second position that places the device in direct contact with the feedthrough.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an example system in accordance with one or more embodiments of the invention.

FIG. 1.2 shows a diagram of the example system of FIG. 1.1 in a first configuration in accordance with one or more embodiments of the invention.

FIG. 1.3 shows a diagram of the example system of FIG. 1.1 in a second configuration in accordance with one or more embodiments of the invention.

FIG. 2.1 shows a diagram of a second data processing device in accordance with one or more embodiments of the invention.

FIG. 2.2 shows a first cross section diagram of the data processing device of FIG. 2.1.

FIG. 2.3 shows a diagram of a constrainer in accordance with one or more embodiments of the invention.

FIG. 2.4 shows a first side view diagram of the constrainer in accordance with one or more embodiments of the invention.

FIG. 2.5 shows a second side view diagram of the constrainer in accordance with one or more embodiments of the invention.

FIG. 2.6 shows a third side view diagram of the constrainer in accordance with one or more embodiments of the invention.

FIG. 2.7 shows a fourth side view diagram of the constrainer in accordance with one or more embodiments of the invention.

FIG. 2.8 shows a fifth side view diagram of the constrainer in accordance with one or more embodiments of the invention.

FIG. 2.9 shows a side view diagram of a constrainer array in accordance with one or more embodiments of the invention.

FIG. 2.10 shows an isometric view diagram of the constrainer array in accordance with one or more embodiments of the invention.

FIG. 2.11 shows a cross section diagram of a data processing device including constrainers in accordance with one or more embodiments of the invention.

DETAILED DESCRIPTION

Figure 3:
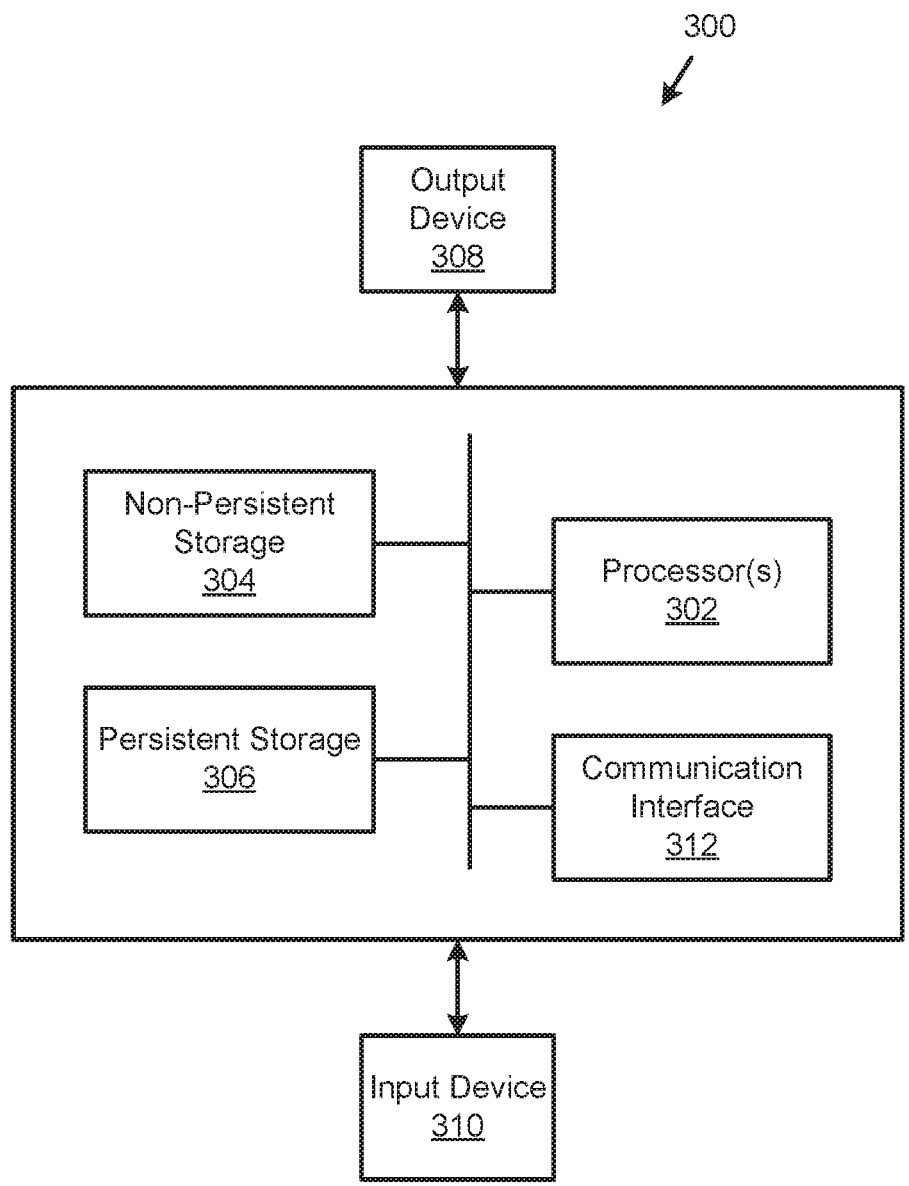
FIG. 3 shows a diagram of a computing device in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing electromagnetic interference in a high-density environment. Specifically, embodiments of the invention may provide a system that manages electromagnetic interference at a data processing device level. By doing so, embodiments of the invention may facilitate the inclusion of electromagnetic interference emitting devices in a high-density environment while mitigating the impact of electromagnetic interference generated by the electromagnetic interference emitting devices.

In one or more embodiments of the invention, the data processing device includes constrainers. A constrainer may be a device adapted to position and/or orient a device while the device is disposed in the data processing device. The constrainer may position and/or orient the device to facilitate forming of one or more mechanical connections between the device and/or other devices. The one or more mechanical connections may support electrical connections between the devices that facilitate provisioning of power and/or communications between the device and other devices while the data processing device isolates the device from other devices to manage electromagnetic interference.

FIG. 1.1 shows an example system in accordance with one or more embodiments of the invention. The system may include a frame (100) and any number of data processing devices (102). The components of the example system may provide electromagnetic interference management services (e.g., managing propagation of electromagnetic radiation) for devices disposed within the data processing devices (102). By doing so, devices that emit electromagnetic interference (e.g., electromagnetic radiation generated by the devices) may be utilized in a high-density computing environment without negatively impacting the high-density computing environment.

For example, one or more electromagnetic interference emitting devices may be disposed within one or more of the data processing devices (102). The system illustrated in FIG. 1.1 may manage the electromagnetic interference generated by the one or more electromagnetic interference emitting devices by (i) limiting the space in which electromagnetic interference is allowed to freely propagate and (ii) attenuating the electromagnetic interference as it propagates out of the limited space.

To do so, the system of FIG. 1.1 may reduce the strength of the electromagnetic interference when propagating from inside of a portion of the data processing devices (102) to an ambient environment (or other portions of the data processing devices (102)) around the data processing devices (102) and/or other locations by at least 90 decibels (or another suitable level of suppression such as, for example, between 30-45 decibels, between 45-60 decibels, between 60-75 decibels, between 75-90 decibels, or greater than 90 decibels).

For example, a data processing device in accordance with embodiments of the invention may provide greater than 35 decibels of isolation, between 35-50 decibels of isolation, between 50-65 decibels of isolation, between 65-80 decibels of isolation, and/or greater than 80 decibels of isolation.

The electromagnetic interference isolation provided by the data processing devices (102) may have a frequency dependent response. For example, the data processing devices (102) may provide at least 90 decibels (dB), or another suitable level of isolation, across a frequency band in which devices that may be disposed within the data processing devices (102) are adapted to emit electromagnetic interference. In other frequency bands, the data processing devices (102) may provide different level or no electromagnetic interference isolation for devices disposed within the data processing devices (102).

Accordingly, a data processing device in accordance with one or more embodiments of the invention may provide electromagnetic interference suppression services that are frequency dependent. In one or more embodiments of the invention, a data processing device provides electromagnetic interference isolation by reducing the strength of electromagnetic interference across at least one frequency band by a predetermined amount (e.g., 90 decibels).

Additionally, the system of FIG. 1.1 may provide for the positioning and orienting of devices disposed within the data processing devices (102). To do so, one or more of the data processing devices may include a constrainer. The constrainer may limit where devices may be disposed within the data processing devices (102) and the orientation of such devices within the data processing devices. By limiting the positioning and orientation of the devices, the constrainers may (i) facilitate efficient cooling of the devices, (ii) enable a high density of such devices to be included in the data processing devices, and/or (iii) reduce the likelihood of damage to the data processing devices (102) and/or the devices while the devices are disposed in the data processing devices (102) and/or while the devices are being moved within the data processing devices (102).

In one or more embodiments of the invention, one or more of the devices are electromagnetic interference emitting devices. Such devices may intentionally emit electromagnetic radiation as part of their normal operation. An electromagnetic interference emitting device may be, for example, a cellular telephone or other type of devices that utilizes one or more wireless connections as part of their operation.

The electromagnetic interference emitted by an electromagnetic interference emitting device may be frequency dependent. That is, the electromagnetic interference emitted by the electromagnetic interference emitting device may be stronger in a first frequency band and weaker in a second frequency band. To provide electromagnetic interference suppression services, a data processing device in accordance with one or more embodiments of the invention may attenuate the electromagnetic interference emitted by an electromagnetic interference emitting device by at least a predetermined amount (e.g., 80 decibels) across at least one frequency band in which the electromagnetic interference emitting device emits electromagnetic interference. The at least one frequency band may be, for example, the frequency band in which the emitted electromagnetic interference has a largest magnitude.

In one or more embodiments of the invention, an electromagnetic interference emitting device emits electromagnetic interference having frequency content between 700 megahertz and 10 gigahertz. An electromagnetic interference emitting device may emit electromagnetic interference having different frequency content without departing from the invention.

To further discuss aspects of embodiments of the disclosed technology, each component of the system of FIG. 1.1 is discussed below.

In one or more embodiments of the invention, the frame (100) is a physical structure. The physical structure may be adapted to facilitate storage of the data processing devices (102) in a high-density computing environment. The high-density computing environment may be, for example, a data center or another type of location where multiple data processing devices are located. To facilitate storage of the data processing devices (102), the frame (100) may include any number of structural members (e.g., beams, brackets, bars, etc.) and any number of mechanical mounting points (e.g., holes, threaded portions, etc.) disposed on the structural members to facilitate storage of the data processing devices (102).

Different structural members may have different shapes, sizes, and/or other physical characteristics. The shapes, sizes, and/or other physical characteristics of the structural members may be adapted to enable the structural members to be mechanically connected (e.g., permanently or reversibly connected) to each other to form a predetermined structure. The predetermined structure may be, for example, a cage, box, or other type of structure that facilitates positioning and/or orienting the data processing devices (102).

When all, or a portion, of the structural members are mechanically connected to each other, the mechanical mounting points may be disposed at predetermined locations. The predetermined locations may correspond to similar predetermination locations on the data processing devices (102) where mechanical mounting elements, complementary to the mechanical mounting point, are disposed. By doing so, the frame (100) and the data processing devices (102) may be adapted to position the data processing devices (102) in locations and/or orientations compatible with a high-density computing environment, or another environment in which the data processing devices (102) may be located.

The mechanical mounting points may be any type of physical structure for attaching (permanently or reversibly) the data processing devices (102) to the frame (100). There may be any number of mechanical mounting points to facilitate the attachment of any number of data processing devices.

The frame (100) may be implemented using any number of suitable materials. For example, portions of the frame (100) may be implemented using metals (e.g., steel, aluminum, etc.). In another example, portions of the frame (100) may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the frame (100) may be implemented using rubber (e.g., latex, styrene-butadiene rubbers, etc.) The frame (100) may be implemented using any quantity and combination of suitable materials without departing from the invention.

In one or more embodiments of the invention, the data processing devices (102) are physical structures. For example, the data processing devices (102) may include a chassis and one or more computing devices disposed within the chassis. For additional details regarding computing devices, refer to FIG. 5.

A chassis may be a mechanical device that is adapted to (i) facilitate attachment of the data processing device to the frame, (ii) house the one or more computing devices, (iii) house one or more electromagnetic interference emitting devices, and/or (iv) provide thermal management services to the computing devices and/or the electromagnetic interference emitting devices. For example, a chassis may be a frame mountable structure (e.g., a rectangular box) that includes internal space that may be used to house computing devices and/or electromagnetic interference emitting devices. Thus, the chassis may be a frame mountable chassis.

The chassis may be implemented using any number of suitable materials. For example, portions of the chassis may be implemented using metals (e.g., steel, aluminum, etc.). In another example, portions of the chassis may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the chassis may be implemented using rubber (e.g., latex, styrene-butadiene rubbers, etc.) The chassis may be implemented using any quantity and combination of suitable materials without departing from the invention.

To facilitate attachment of the data processing device to the frame, the chassis may include any number of mechanical mounting elements. The mechanical mounting elements may be located at predetermined locations. The predetermined locations may correspond to similar predetermination locations on the frame (100) where mechanical mounting points, complementary to the mechanical mounting elements, are disposed.

For example, a mechanical mounting element may be a rail disposed on a side of a chassis of a data processing device. The location of the rail may correspond to a position on the frame (100) where a rail guide (i.e., a complementary mechanical mounting point) is disposed. The rail and the rail guide may facilitate attachment of a data processing device to the frame (100) which, in turn, positions and orients the data processing device relative to the frame (100).

To house the one or more computing devices, the chassis may include one or more internal volumes. The internal volumes may facilitate disposing of the one or more computing devices (and/or other devices such as electromagnetic interference emitting devices) within a data processing device.

To house the one or more electromagnetic interference emitting devices, the chassis may include one or more internal volumes. The internal volumes may have a shape or other characteristic(s) that facilitates disposing of the one or more electromagnetic interference emitting devices within the data processing device. For example, an internal volume of the chassis may be a rectangular (or other shaped) void capable of housing one or more electromagnetic interference emitting devices and/or other types of devices.

In one or more embodiments of the invention, the one or more internal volumes of the data processing devices are adapted to restrict propagation of electromagnetic interference emitted by the electromagnetic interference emitting devices (and/or other devices such as computing devices). For example, one or more portions of the chassis that bound the one or more internal volumes may be made of metal of a predetermined thickness to prevent and/or limit transmission of electromagnetic interference through the one or more portions of the chassis. By doing so, the electromagnetic interference generated by the electromagnetic interference emitting devices may be prevented (or at least severely attenuated when leaving an internal volume) from propagating from within the data processing devices (102) into the ambient environment surrounding the respective data processing devices (102).

In another example, one or more portions of the chassis that bound the one or more internal volumes may be formed in a manner that filters (e.g., reflects/attenuates radiation of a certain frequency while allowing radiation of other frequencies to propagate) electromagnetic radiation when electromagnetic radiation passes through the portions of the chassis. For example, a portion of the chassis that bounds the one or more internal volumes may be a waveguide filter such as an array of holes (e.g., sub-wavelength apertures corresponding to a particular frequency below which are severely attenuated) in a metal sheet. By doing so, the electromagnetic interference generated by the electromagnetic interference emitting devices may be severely attenuated (e.g., attenuated by greater than 90 decibels or another suitable level) when propagating from within the data processing devices (102) into the ambient environment surrounding the respective data processing devices (102).

In a further example, one or more portions of the chassis that bound the one or more internal volumes may be made of an electromagnetic radiation attenuating material of a predetermined thickness to prevent and/or limit transmission of electromagnetic interference (e.g., electromagnetic radiation) through the one or more portions of the chassis. The electromagnetic radiation attenuating material may be, for example, a composite of plastic or rubber that includes particulates of iron, carbonyl iron, or other electromagnetically lossy material(s). By doing so, the electromagnetic interference generated by the electromagnetic interference emitting devices (and/or other types of devices) may be severely attenuated (e.g., attenuated by greater than 90 decibels or another suitable level) when propagating from within the data processing devices (102) into the ambient environment surrounding the respective data processing devices (102).

To provide thermal management services to the computing devices, the electromagnetic interference emitting devices, and/or other types of devices, the data processing devices (102) may facilitate the flow of gas proximate to the computing devices and/or electromagnetic interference emitting devices. By doing so, the thermal state (i.e., temperature) of the aforementioned devices may be regulated. The gas may be air or another type/combination of gasses obtained from any source.

For example, a data processing device may include one or more vents that enable gas from a first side of a data processing device to flow into the data processing device, through the data processing device, and out of a second side of the data processing device. The gas, flowing through the data processing device, may be at a different temperature than the computing devices and/or electromagnetic interference emitting devices. Consequently, thermal exchange between the flow of gas and the aforementioned devices may occur resulting in the temperature of the aforementioned devices changing. By doing so, heat generated by the aforementioned devices may be expelled from the devices thereby regulating the temperature of the aforementioned devices.

A system in accordance with embodiments of the invention may include any number of data processing devices. Different data processing devices (102) may have different configurations and/or uses within the system.

For example, some data processing devices may be adapted to house many electromagnetic interference emitting devices (and/or other types of devices) while other data processing devices may be primarily adapted to house computing devices. Additional data processing devices may be adapted to exclusively house data processing devices and no electromagnetic interference emitting devices. A system in accordance with embodiments of the invention may include any number and combination of data processing devices adapted for any number of different uses without departing from the invention.

By way of example, the system of FIG. 1.1 may include a first data processing device (104). The first data processing device (104) may be of a larger size than a second data processing device (106) and, consequently, may be capable of housing a larger number of electromagnetic interference emitting devices and/or other types of devices. The system of FIG. 1.1 may further include a third data processing device (108). In contrast to the first data processing device (104) and the second data processing device (106), the internal structure of the third data processing device (108) may be adapted to only house computing devices rather than electromagnetic interference generating devices.

For additional details regarding data processing devices, refer to FIGS. 2.1-2.11.

As discussed above, data processing devices (102) may house electromagnetic interference emitting devices. When so housed, the electromagnetic interference emitting devices may operate thereby generating electromagnetic interference (e.g., electromagnetic radiation). At different points in time, it may be useful to add or remove electromagnetic interference emitting devices to or from the data processing devices (102). To facilitate such additions and/or removals, different portions of the data processing devices (102) may be adapted to reversibly provide access to the internal volumes of the data processing devices.

For example, the different portions of the data processing devices (102) may be adapted to rotate, translate, or otherwise move with respect to the remaining portions of the data processing devices (102). When the different portions of the data processing devices (102) are in a first predetermination position and/or orientation, they may electromagnetically seal one or more internal volumes of the data processing devices (102). That is, they may limit the extent to which electromagnetic radiation within the internal volumes is able to propagate to an ambient environment. However, when the different portions of the data processing devices (102) are rotated, translated, and/or otherwise moved to a second predetermined position and/or orientation to enable access to the internal volumes, the data processing devices (102) may not be electromagnetically sealed. Consequently, electromagnetic radiation within the internal volumes may be less limited by the data processing devices (102) to propagate into the ambient environment when access to the internal volumes is provided.

The data processing devices (102) may include hinges, slides, knobs, and/or other mechanical devices that facilitate movement of the different portions of the data processing devices (102) to reversibly reconfigure the data processing devices (102) between states where access (i.e., physical accessibility) to the internal volumes of the data processing devices (102) is provided and states where access to the internal volumes of the data processing devices (102) is not provided. FIGS. 1.2-1.3 show diagrams of the data processing devices (102) facilitating the addition, modification, and/or removal of electromagnetic interference emitting devices from the internal volumes of the data processing devices (102).

While the system of FIG. 1.1 has been illustrated as including a limited number of components, a system in accordance with embodiments of the invention may include any number of frames, data processing devices, and/or other components without departing from the invention. For example, any number of frames (and/or other types of physical devices for positioning/orienting devices) may be used in a high density computing environment to facilitate the placement and/or orientation of any number of data processing devices. Further, the frames may be used to position and/or orient other types of devices. The other types of devices may be, for examples, servers, storage nodes, compute nodes, communication devices (e.g., switches, routers, etc. for facilitating communications between any number of devices and/or devices external to a high density computing environment), or any other type of device that may be used in a computing environment (e.g., data center, computing nodes, communications center, etc.). Thus, the frame and data processing devices may be used in conjunction with any number and/or type of other device without departing from the invention.

FIG. 1.2 shows a diagram of the example system of FIG. 1.1 in a configuration (i.e., after a reconfiguration from the configuration illustrated in FIG. 1.1) where a front vent (110) of the first data processing device (104) has been opened. The front vent (110) may be opened by physically rotating and/or translating the front vent (110) to move the front vent (110) to a new physical location. By opening the front vent (110), physical access to internal volumes of the first data processing device (104) may be provided. Consequently, the internal configuration of the internal volumes of the first data processing device (104) may be modified. For example, electromagnetic interference emitting devices may be removed from and/or added to the internal volumes.

Similarly, computing devices may be added to and/or removed from the internal volumes.

However, in the state illustrated in FIG. 1.2, the ability of the first data processing device (104) to limit propagation of and/or attenuate electromagnetic interference generated by electromagnetic interference emitting devices disposed within the first data processing device (104) may be compromised. In other words, the first data processing device (104) may be in an electromagnetic interference suppression compromised state that allows electromagnetic interference within internal volumes of the first data processing device (104) to propagate to the ambient environment around the first data processing device (104) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the first data processing device (104) automatically causes all, or a portion, of the electromagnetic interference emitting devices disposed within its internal volumes to suspend generation of electromagnetic interference when in the electromagnetic interference suppression compromised state illustrated in FIG. 1.2. By doing so, the first data processing device (104) may provide electromagnetic interference management services when the first data processing device (104) is in an electromagnetic interference suppression compromised state. All, or a portion, of the data processing devices of a system in accordance with embodiments of the invention may provide similar electromagnetic interference management services.

Similar to FIG. 1.2, FIG. 1.3 shows a diagram of the example system of FIG. 1.1 in a second configuration (i.e., after a reconfiguration from the configuration illustrated in FIG. 1.1) where a top door (112) of the second data processing device (106) has been opened after translating the second data processing device (106) with respect to the frame. The top door (112) may be all, or a portion, of the chassis that may be reversibly moved to enable access to internal volumes of the first data processing device (104).

To open the top door (112), for example, the second data processing device (106) may be mounted to the frame (100) via rails that enable the second data processing device (106) to translate with respect to the frame (100) via application of physical force. Once translated to a predetermined location, the top door (112) may be opened by application of physical force by a user.

By opening the top door (112), physical access to the internal volumes of the second data processing device (106) may be provided. Consequently, the internal configuration of the internal volumes of the second data processing device (106) may be modified. For example, electromagnetic interference emitting devices may be removed from and/or added to the internal volumes of the second data processing device (106). Similarly, computing devices may be added to and/or removed from the internal volumes of the second data processing device (106).

However, in the state illustrated in FIG. 1.3, the ability of the second data processing device (106) to limit propagation of and/or attenuate electromagnetic interference generated by electromagnetic interference emitting devices disposed within the second data processing device (106) may be compromised. In other words, the second data processing device (106) may be in an electromagnetic interference suppression compromised state that allows electromagnetic interference within internal volumes of the second data processing device (106) to propagate to the ambient environment around the second data processing device (106) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels or another suitable level when propagating out of the internal volumes).

In some embodiments of the invention, the second data processing device (106) automatically causes all, or a portion, of the electromagnetic interference emitting devices disposed within its internal volumes to suspend generation of electromagnetic interference when in the electromagnetic interference suppression compromised state illustrated in FIG. 1.3. By doing so, the second data processing device (106) may provide electromagnetic interference management services when the second data processing device (106) is in an electromagnetic interference suppression compromised state. All, or a portion, of the data processing devices of a system in accordance with embodiments of the invention may provide similar electromagnetic interference management services (e.g., automatically terminating and/or resuming the electromagnetic interference generation depending on the electromagnetic interference suppression state of the data processing device).

Thus, as illustrated in FIGS. 1.1-1.3, a system in accordance with embodiments of the invention may provide electromagnetic interference management services to devices disposed with the data processing devices when the data processing devices are in an electromagnetic interference suppression compromised state or an electromagnetic interference suppressed state.

As discussed above, a system in accordance with one or more embodiments of the invention may include one or more data processing devices. FIGS. 2.1-2.11 show diagrams of data processing devices in accordance with embodiments of the invention.

FIG. 2.1 shows a diagram of the second data processing device (106) in accordance with one or more embodiments of the invention. As discussed above, the second data processing device (106) may provide electromagnetic interference management services for electromagnetic interference emitting devices disposed within the second data processing device (106). In addition to electromagnetic interference management services, the second data processing device (106) may provide power management services and communications services. The aforementioned services may be provided to electromagnetic interference emitting devices and/or computing devices and/or other types of devices disposed within the second data processing device (106).

To do so, the second data processing device (106) may include a chassis (198). The chassis (198) may be a structure that is mountable to a frame. By being mountable to a frame, the chassis (198) may be usable in a high density environment. For example, the chassis (198) may be a rail mount chassis. The chassis (198) may be mountable via other methods (e.g., using mechanical features other than rails such as bolts, screws, pins, etc.).

The chassis (198) may include a front vent (200), a rear vent (204), a support module (208), and a payload module (210). Each of these components of the second data processing device (106) is discussed below.

The front vent (200) may be a physical device for (i) enabling gas flow through the second data processing device (106) and (ii) limiting the propagation of electromagnetic interference from an internal volume of the second data processing device (106) and/or attenuating electromagnetic interference that propagates from an internal volume of the second data processing device (106) to an ambient environment around the second data processing device (106) via the front vent (200).

In one or more embodiments of the invention, the front vent (200) reflects and/or attenuates electromagnetic radiation that is propagating from the internal volume (214) to an ambient environment through the front vent (200) by at least 90 decibels (or another suitable level such as, for example, 30 decibels, 45 decibels, 60 decibels, 75 decibels, etc.). By doing so, the front vent (200) may delineate one of the walls of the internal volume to enable the internal volume to be electromagnetically suppressed and/or isolated by 90 decibels (or another suitable level of suppression/isolation) from the ambient environment and/or other portions of the chassis (e.g., the support module (208)).

In one or more embodiments of the invention, the front vent (200) is a rectangular structure formed with holes (202) that enables gas to flow between the ambient environment surrounding the second data processing device (106) and an internal volume of the second data processing device (106). By doing so, the second data processing device (106) may provide thermal management services to components disposed within the second data processing device (106) by controlling the flow of gasses from the ambient environment through the second data processing device (106).

For example, the second data processing device (106) may be used in a high-density computing environment in which a source of cool gas is supplied to a first side of the second data processing device (106). In such an environment, the second data processing device (106) may cause the cool gas to flow into the second data processing device (106) via the front vent (200) and exhaust gas out a second side of the second data processing device (106) (e.g., out of the support module (208)). Alternatively, the second data processing device (106) may cause a reverse gas flow, with respect to the gas flow discussed above, if the source of cool gas is supplied proximate to the support module (208) rather than proximate to the front vent (200).

The structure of the front vent (200) may also be adapted to limit propagation of electromagnetic radiation through the front vent (200) and/or attenuate electromagnetic radiation that propagates through the front vent (200). For example, the size, position, number, shape, and/or other characteristics of the holes (202) through the front vent may be adapted to (i) limit propagation of electromagnetic radiation and/or (ii) attenuate propagating electromagnetic radiation. In another example, the thickness and material choice of the front vent (200) may be adapted to (i) limit propagation of electromagnetic radiation and/or (ii) attenuate propagating electromagnetic radiation. By being so adapted, the front vent (200) may attenuate electromagnetic radiation that propagates through the front vent (200) by at least 90 decibels or another desirable level (e.g., 30 decibels, 45 decibels, 60 decibels, 75 decibels, 120 decibels, etc.).

To facilitate the flow of gas between the ambient environment and the internal volume of the second data processing device (106), the size, position, number, shape, and/or other characteristics of the holes (202) may be selected to meet gas flow requirements for thermal management purposes while providing electromagnetic interference suppression characteristics.

In one or more embodiments of the invention, the rear vent (204) is similar to the front vent (200). For example, the rear vent (204) may provide similar attenuation and/or restriction of propagation of electromagnetic radiation while enabling gasses to flow between internal volumes of the second data processing device. The rear vent (204) may have a similar structure to that of the front vent (200). However, the structure (e.g., different hole pattern, thickness, hole type, etc.) and/or electromagnetic (e.g., attenuation and/or reflection of electromagnetic radiation) and/or hydrodynamic (e.g., impedance to fluid flow) characteristics of the rear vent (204) may be different from the front vent (200) without departing from the invention.

The payload module (210) may be a physical device for (i) housing electromagnetic interference devices (and/or other types of devices), (ii) limiting propagation of electromagnetic interference from internal volumes of the second data processing device (106) to the ambient environment surrounding the second data processing device (106), and/or (iii) thermally regulating devices disposed within the payload module (210). For additional details regarding the payload module (210), refer to FIG. 2.2.

The support module (208) may be a physical device for housing devices that provide services to devices disposed within the payload module (210). For example, the support module (208) may house one or more power supplies (e.g., a power system), fans (e.g., a thermal management system), networking devices (e.g., a communication system), and/or computing devices. The aforementioned devices may provide corresponding services to devices disposed in other portions of the second data processing device (106) and/or devices located in other locations (i.e., external to the second data processing device (106).

In one or more embodiments of the invention, the support module (208) does not provide electromagnetic interference management services to devices disposed within the support module (208), in contrast to the payload module (210). For example, the support module (208) may not intentionally isolate electromagnetic interference generated by devices disposed within the support module (208) from the ambient environment surrounding the second data processing device (106). Intentionally isolating electromagnetic interference means that the structure of a physical structure is adapted to provide such isolation. While many types of physical structures may provide some degree of electromagnetic interference isolation as an inherent consequence of their existence, the electromagnetic interference isolation is not intended. Rather, the physical structures may exist for their other properties such as mechanical strength while providing some degree (albeit low) of electromagnetic interference isolation. Thus, while the support module (208) may to some degree electromagnetically separate devices disposed within the support module (208) from the ambient environment, the support module (208) does not provide electromagnetic interference management services. Providing electromagnetic interference management services may refer to providing at least 20 decibels of attenuation.

In one or more embodiments of the invention, providing electromagnetic interference management services reduces the strength of electromagnetic radiation by at least 20 decibels when the electromagnetic radiation propagates from an internal volume of a data processing device to an ambient environment outside of the data processing device.

The one or more power supplies may supply power to other devices. For example, the power supplies may provide power to electromagnetic interference emitting devices disposed within the payload module (210), other types of devices (e.g., computing device) disposed within the payload module, and/or devices located in other portions of the second data processing device.

The one or more power fans may provide thermal management services to other devices. For example, the fans may regulate the flow of gasses through the second data processing device and, consequently, manage the thermal state of electromagnetic interference emitting devices and/or other types of devices disposed in the payload module (210) and/or the support module (208).

The one or more power networking devices may provide communication services to other devices (e.g., providing network services). For example, the networking devices may manage network interfaces that enables the second data processing device (106) to communicate with other devices (e.g., computing devices that may be controlling the operation of the electromagnetic interference emitting devices).

The one or more computing devices may manage the operations of the other entities of the second data processing device (106). For example, the computing devices may send messages to the electromagnetic interference emitting devices (and/or other types of devices disposed within the payload module or other portions of the second data processing device) to perform predetermined functionality. Such messages, when received by the electromagnetic interference emitting devices may cause the electromagnetic interference emitting devices to stop and/or start emitting electromagnetic interference (and/or perform other actions).

The computing devices may send such instructions when (or around the time when) the electromagnetic interference suppression state of the second data processing device (106) is changed (i.e., when portions of the second data processing device (106) are physically reconfigured). The computing devices may make such determinations based on any number of sensors (not shown) that monitor the physical configuration of the second data processing device (106). The sensors may be disposed, for example, in the payload module, on the vents, or at other locations such that measurements by the sensors indicate the thermal state of components of the second data processing device for which thermal management services (e.g., monitoring the thermal state of components and taking actions such as modifying the rate of gas flow to manage the thermal state of the components) are being provided.

In another example, the computing devices may send messages to fan controllers (not shown) or other devices that manage the operation of gas flow control devices disposed within the second data processing device (106). The computing devices may send such messages based on the thermal state (i.e., temperature) of one or more devices disposed within the second data processing device (106). The computing devices may monitor such thermal states using any number of sensors (not shown) and/or based on messages received from the one or more devices disposed within the second data processing device (106).

In response to receipt of such messages, the fan controllers or other devices may modify the operational state of the gas flow control devices. By doing so, the computing devices may change the thermal state of devices disposed within the second data processing device (106) by controlling the flow of gasses through the second data processing device (106).

For additional details regarding computing devices, refer to FIG. 3.

To further clarify aspects of embodiments of the invention, a cross section diagram of the second data processing device (106) in accordance with one or more embodiments of the invention is shown in FIG. 2.2. In FIG. 2.2, the cross section is taken along the X-Y plane illustrated in FIG. 2.1.

As seen from FIG. 2.2, the payload module (210) may include an internal volume (214). The internal volume (214) may be used to house devices such as electromagnetic interference emitting devices, supports for such devices, and/or other types of devices that may provide services to the electromagnetic interference emitting devices and/or other devices.

The internal volume (214) may be bounded, on four sides, by portions of the payload module (210). For example, the internal volume (214) may be bounded by a top door (212), a bottom (218), a first side (216), and a second side (not shown). These four components of the payload module (210) may define a rectangular shape of the internal volume (214).

The internal volume (214) may be further bounded, on a fifth and sixth side, by the front vent (200) and the rear vent (204). The front vent (200) and the rear vent (204) may be on opposite sides of the internal volume (214). By doing so, the front vent (200) and the rear vent (204) may define a gas flow path through the payload module (210). For example, gasses may be able to flow from between the two vents through the internal volume (214).

As discussed above, the second data processing device may control gas flows disposed within the second data processing device to provide thermal management services. To do so, the second data processing device may include a thermal management system (220). The thermal management system (220) may include (i) flow control devices, (ii) temperature sensors, and/or (iii) a controller.

The controller may operate the flow control devices based on temperature information (e.g., thermal states) obtained from the temperature sensors and/or temperature information obtained from other devices (e.g., from electromagnetic interference emitting devices). For example, the controller may increase the flow rate of a gas flow disposed within the second data processing devices to manage the temperature of one or more devices within a predetermined range.

The flow control devices may be, for example, fans, actuatable ducting, or other types of active devices for controlling the flow of gasses. The thermal management system (220) may include any number of flow control devices without departing from the invention.

The second data processing device may also include a power system (222). The power system may provide power to any number and/or types of devices disposed within the second data processing device. For example, the power system (222) may provide power to electromagnetic interference emitting devices (and/or other types of devices) disposed within the payload module (210), the thermal management system (220), a communication system (224), and/or computing devices (226).

To do so, the power system (222) may include, for example, one or more power supplies, regulators, controllers, and/or other types of components for providing power. The aforementioned components may identify components to which power is to be supplied, identify a quantity of power to supply to each of the components, and/or provide the power to each of the respective components. As will be discussed in greater detail below, the power system (222) may provide power using an interconnect (230).

The second data processing device may further include a communication system (224). The communication system (224) may provide communication services to devices disposed within the second data processing devices and devices disposed outside of the second data processing devices. To do so, the communication system (224) may support any number of operable connections between the aforementioned devices. The operable connections may utilize any combination of wired and/or wireless networks to facilitate the transmission of data between the aforementioned devices.

Providing communication services may include, for example, exchanging network data units among devices disposed in the payload module, the computing device (226) disposed in the support module (208), and/or other devices disposed outside of the second data processing device. By doing so, the aforementioned devices may communicate with one another via information included in the exchanged network data units. A network data unit may be a communication supported by a communication protocol that enables information to be transmitted. A network data unit may be, for example, a packet in the event that an internet protocol is utilized for transmission of network data units. As will be discussed in greater detail below, the communication system (224) may provide the communication services using an interconnect (230).

The computing device (226) may manage the operation of the components of the second data processing device. For example, the computing device (226) may manage the thermal management system (220), the power system (222), the communication system (224), and/or other components (such as electromagnetic interference emitting devices) disposed within the second data processing device. To manage the other devices, the computing device (226) may use the communication services provided by the communication system (224) as well as the interconnect (230).

The interconnect (230) may be a physical device for providing operable connections between devices disposed within the second data processing device. The interconnect (230) may support distribution of power by the power system (222) to any number of devices disposed within the payload module (210), the support module (208), and/or other locations.

For example, the interconnect (230) may include a set of wires that physically interconnect devices disposed within the second data processing device. The set of wires may include any number of wires. The interconnect (230) may include different structures for providing operable connections such as, for example, circuit board traces or other wiring form factors.

In one or more embodiments of the invention, the interconnect (230) facilitates distribution of power to electromagnetic interference emitting devices disposed within the payload module (210) while the electromagnetic interference emitting devices are isolated. By doing so, the electromagnetic interference emitting devices may be provided power without negatively impacting the operation of other devices due to electromagnetic interference generated by the electromagnetic interference emitting devices.

The interconnect (230) may also facilitate transmission of information between devices disposed in the payload module (210) and the support module (208). For example, the interconnect (230) may include wired connections (e.g., twisted pair, coaxial cabling, etc.) that facilitate transmission of information via electrical signals.

To do so, the second data processing device may include a back-plane (232). The back-plane may electromagnetically isolate the interconnect (230) from the internal volume of the payload module (210). For example, the back-plane (232) may be a metal sheet of sufficient thickness to prevent electromagnetic interference (e.g., electromagnetic radiation, local electromagnetic near fields, etc.) from penetrating through the back-plane (232).

The back-plane (232) may include any number of feedthroughs (234). The feedthroughs (234) may be physical devices that enable the interconnect (230) to physically connect to any number of devices disposed within the payload module (210). The feedthroughs (234) may be shielded to electromagnetically isolate the internal volume from the interconnect (230).

As discussed above, devices may be disposed in the internal volume (214). To do so, various portions of the second data processing device may be adapted to physically move to enable the additional devices to be inserted into the internal volume (214). Additionally, when disposing the devices in the internal volume (214), the devices may be operably connected to other devices using the interconnect (230).

When disposing such devices in the internal volume, the location and/or orientation of and during disposition may impact the stability of the system. For example, if a device is improperly oriented while being disposed in the internal volume (214), the device may not properly operably connect to the interconnect (230). Further, disposing the device while improperly oriented during the disposition may cause physical damage to the device and/or portions of the interconnect (230) (and/or other portions of the second data processing device).

To facilitate positioning and/orienting of devices while and after disposition in the internal volume, the second data processing device may include any number of constrainers. A diagram of a constrainer (239) in accordance with one or more embodiments of the invention is illustrated in FIG. 2.3.

The constrainer (239) may be a physical device adapted to position and/or orient devices while the devices are disposed in a data processing device. For example, the constrainer (239) may be adapted to (i) while in a first state, receive a device, (ii) orient the device as the constrainer (239) transitions from the first state to a second state, and/or (iii) be mechanically stable (e.g., may be under strain or other types of force that tends to maintain a current shape of the constrainer) while in the first state and the second state. The constrainer (239) may be mechanically unstable (e.g., may be under strain or other type of force that tends to modify a shape of the constrainer and/or reorient/reposition different positions of the constrainer).

To provide the aforementioned functionality, the constrainer (239) may include a base (260) and a pair of arms (240, 250). The base (260) may be a physical structure adapted to (i) receive a portion of a device, (ii) position and/or orient the portion of the device while disposed in the constrainer (239), and (iii) enable physical access to a sub-portion of the device while the portion of the device is received.

To receive the portion of the device, the base (260) may include grips (262) adapted to mechanically position and/or orient the portion of the device. For example, the grips (262) may be a trough or another physical structure having a shape that is complimentary to a shape of the portion of the device. When received by the constrainer (239), the grips (262) may limit the ability of the device to translate and/or rotate.

To provide physical access to the sub-portion of the device, the base (260) may include an aperture (266). The aperture (266) may be a through-hole or other type of void in the base that, when the device is received by the constrainer, the sub-portion of the portion of the device is disposed proximate to the aperture (266). The aperture (266) may have any shape without departing from the invention.

As will be discussed in greater details, below, the base (260) may also include a compliant element (264) that enables portions of the base (260) delineated to be translated and/oriented with respect to the other portions. Translating and/or orienting the portions of the base (260) delineated by compliant element (264) may be used the facilitate transition between the mechanically stable states of the constrainer (239).

The compliant element (264) may be, for example, a portion of the base (260) that divides the base (260) into two mirrored portions. The portion of the base (260) may have a thickness that is smaller than the two mirrored portions.

Base (260) may have a length which separate the locations on the base (260) to which the arms (240, 250) attach. The length may be divided into two equal portions by the compliant element (264). Consequently, the two equal portions of the length of the base may be able to be positioned and/or oriented with respect to each other due to the compliant element (264) dividing the length.

The two pairs of arms (240, 250) may be physical structures adapted to (i) receive a second portion of the device and (ii) position and/or orient the second portion of the device while disposed in the constrainer (239).

To receive the second portion of the device, the arms (240, 250) may include grips (242, 252) adapted to mechanically position and/or orient the second portion of the device. For example, the grips (242, 252) may be a trough or another physical structure having a shape that is complimentary to a shape of the second portion of the device. While the device is disposed in the constrainer (239), the grips (242, 252) may limit the ability of the device to translate and/or rotate. By doing so, the grips (242, 252) of the pair of arms (240) and the grips (262) of the base (260) may orient and/or position the device with respect to a portion of constrainer (239). The portion may be, for example, the aperture (266). In turn, the aperture (266) may be positioned and/or oriented with respect to a portion of an interconnect (or another device) to which the device is to be operably connected. In this manner, the constrainer (239) may be used to position and/or orient a device with respect to another device to facilitate operably connecting them while limited the possibility of either of the devices being damaged by operably connecting them to one another. For additional details with respect to positioning and/or orienting devices using constrainers to form operable connections, refer to FIGS. 2.6-2.7.

The two pairs of arms (240, 250) may also include compliant elements (244, 254). The compliant elements (244, 254) may physically connect the respective arms (240, 250) to the base (260). The compliant elements (244, 254) may enable the arms (240, 250) to be independently translated and/oriented with respect to the base (260) and/or each other. Translating and/or orienting the arms (240, 250) may be used to transition the constrainer (239) between the mechanically stable states of the constrainer (239). For additional details regarding the mechanical states of the constrainer, refer to FIGS. 2.4-2.5.

Each of the arms (240, 250) may have a length between the respective compliant elements (244, 254) and the grips (242, 252). The length may be adapted to facilitate positioning and/or orienting of a corresponding type of device. For example, the length may be adapted to position the grip (e.g., 242, 252) at a predetermined location of a device which the constrainer (239) is adapted to position and/or orient. The predetermined location may be, for example, a mid-point of an edge of the device. The predetermined location may be other locations on the device without departing from the invention.

The constrainer (239) may be implemented using any number of suitable materials. For example, portions of the constrainer (239) may be implemented using metals (e.g., steel, aluminum, etc.). In another example, portions of the constrainer (239) may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the constrainer (239) may be implemented using rubber (e.g., latex, styrene-butadiene rubbers, etc.) The constrainer (239) may be implemented using any quantity and combination of suitable materials without departing from the invention.

In one or more embodiments of the invention, the constrainer (239) is a plastic injection molded part. For example, all of the constrainer (239) may be formed of a thermoplastic or other suitable material for plastic injection molding. In other embodiments of the invention, the constrainer (239) may be formed from multiple plastic injection molded parts integrated together to form the constrainer (239).

FIGS. 2.4-2.5 show side view diagrams of the constrainer (239) of FIG. 2.3 in two different states. FIG. 2.4 shows a first side view diagram of the constrainer (239) in accordance with one or more embodiments of the invention. In FIG. 2.4, the constrainer (239) is illustrated in a first state. In the first state, the constrainer (239) may be mechanically stable. That is, forces on different portions of the constrainer (239) may tend to maintain the current shape of the constrainer (239).

In the first state, the separation distance (249) between the grips (242, 252) of the respective arms (240, 250) may be a first predetermined amount. The first predetermined amount may be greater than the corresponding width of the device. Consequently, when in the first state, the constrainer (239) may be adapted to receive the device by having the separation distance (249) to facilitate disposing of the device between the grips (242, 252).

FIG. 2.5 shows a second side view diagram of the constrainer (239) in accordance with one or more embodiments of the invention. In FIG. 2.5, the constrainer (239) is illustrated in a mechanically unstable state. In the mechanically unstable state, the portions of the base (260) delineated by the compliant element (264) may have been reoriented and/or repositioned with respect to each other by the application of physical force. For example, with respect to the orientation in FIG. 2.5, the portions of the base (260) delineated by the compliant element (264) may have been rotated towards each other and around the compliant element (264). Such force may be applied, as will be discussed with respect to FIGS. 2.6-2.7, by disposing a device into the constrainer (239) and, while the device is disposed into the constrainer (239), pressing the device downward thereby causing the base (260) to press against a surface (e.g., a backplane).

When in the mechanically unstable state, forces may tend to reorient and/or reposition portions of the constrainer (239) to place the constrainer (239) back into the first state as illustrated in FIG. 2.4. For example, the compliant element (264) of the base may be put under stress when in the mechanically unstable state which results in a force being applied to the constrainer (239) to place the constrainer (239) in the first state.

Additionally, as seen from FIG. 2.5, the separation distance (249) may be reduced when in the mechanically unstable state when compared to the separation distance (249) when in the first state. Consequently, the constrainer (239) may not be adapted to receive a device while in the mechanically unstable state because the separation distance (249) may be smaller than the width of the device. Consequently, it may not be possible (absent repositioning and/or reorienting the constrainer (239)) to dispose the device in the constrainer (239).

However, when a device is disposed within the constrainer (239) while the constrainer (239) is in the first state, applying a same type of force that placed the constrainer (239) in the mechanically unstable state of FIG. 2.5 may place the constrainer (239) in a second state that is mechanically stable.

FIGS. 2.6-2.7 show side view diagrams of the constrainer (239) of FIG. 2.3 in two states in which the constrainer (239) is mechanically stable. FIG. 2.6 shows a third side view diagram of the constrainer (239) in accordance with one or more embodiments of the invention. The side view diagram of FIG. 2.6 may be similar to that of FIG. 2.4 but includes a device (261) disposed in the constrainer (239) and the constrainer (239) is disposed on an internal volume boundary (273).

As seen in FIG. 2.6, when the device (261) is disposed in the constrainer (239) while the constrainer (239) is in the first state, a feedthrough (270) may be disposed proximate to a feedthrough receiving portion (263) of the device. For example, the constrainer (239) may be disposed in an internal volume of a data processing device which includes an internal volume boundary (273) through which the feedthrough (270) protrudes. The protruding portion of the feedthrough (270) may be any type of connector for forming an operable connection between the interconnect and the device (261). Such an operable connection may be formed when the protruding portion of the feedthrough (270) and the feedthrough receiving portion (263) of the device (261) are mated.

In FIG. 2.6, the constrainer (239) is illustrated in its first state. As noted above, the first state may be mechanically stable. When in the first state, the constrainer (239) may also separate the device (261) from the protruding portion of the feedthrough. By doing so, the constrainer (239) may prevent or reduce the likelihood of the feedthrough receiving portion (263) and/or the protruding portion of the feedthrough (270) from being damaged by the device (261).

For example, as noted above, misalignment of the feedthrough receiving portion (263) and/or the protruding portion of the feedthrough (270) may result in damage to any of the aforementioned components. Both of the aforementioned components may be adapted to mate with each other when both of the aforementioned components are aligned with one another. Consequently, if physical force is applied to aforementioned components while not aligned in an attempted mating (or other type of event) event, any of the components, or portions thereof, may be damaged. The damage may be any type of damage including, but not limited to, physical damage and electrical damage.

As discussed above, to reduce the likelihood of damage occurring, the constrainer (239) (e.g., the base and/or the arms) may be adapted to orient and/or position the device (261) while the constrainer (239) is transitioned from a first state as illustrated in FIG. 2.6 to a second state as illustrated in FIG. 2.7. By doing so, the likelihood of damage occurring during mating events may be reduced.

The constrainer (239) (e.g., the base and/or the arms) may also be adapted to orient and/or position the device (261) while the constrainer (239) is in the second state as illustrated in FIG. 2.7. By doing so, the likelihood of damage occurring while the device (261) is mated to another device events may be reduced.

The constrainer (239) may be adapted to orient and/or position the device (261) by application of physical force while and after the constrainer (239) transitions from the first state to the second state. FIG. 2.7 shows a fourth side view diagram of the constrainer (239) in accordance with one or more embodiments of the invention. The fourth side view diagram may be similar to the third side view diagram of FIG. 2.6 but the constrainer (239) may be in a second state and, consequently, the feedthrough (270) may be mated to the feedthrough receiving portion (263).

As discussed above, the constrainer (239) may be adapted to orient and/or position the device (261) while and after transitioning from the first state to the second state. To do so, the grips of the constrainer (239) may apply physical force to different portions of the device that position and/or orient the device with respect to an aperture of the base of the constrainer (239). As noted above, the constrainer (239), while disposed in a data processing device, may be positioned and/or oriented with respect to a corresponding feedthrough or other physical device that may physically interact with the device (261). For additional details with respect to positioning and/or orienting the constrainer (239) with respect to devices (e.g., feedthroughs), refer to FIGS. 2.8-2.11.

While positioned and/or oriented by the constrainer (239), the device (261) may be operably connected to another device such as a protruding portion of a feedthrough (270). Consequently, the device (261) may be operably connected with a reduced likelihood of damage occurring.

As noted above, the constrainer in FIG. 2.7 is illustrated in a second state. The constrainer (239) may be placed in the second state by, for example, applying force towards a boundary which between the device (261) and the boundary (e.g., 273) the base of the constrainer (239) is disposed. Doing so may cause the portions of the base to be reoriented and/or repositioned with respect to each other. Similarly, the arms may be reoriented and/or repositioned with respect to each other and/or with respect to the base. The aforementioned reorienting and/or repositioning may be facilitated by the compliant elements discussed with respect to FIG. 2.3.

When in the second state, the constrainer (239) may be mechanically stable, in contrast to the mechanically unstable state illustrated in FIG. 2.5. In contrast to the mechanically unstable state, the second state may be mechanically stable due to the disposition of the device (261) that applies force to the arms of the constrainer (239) when the constrainer (239) is in the second state (e.g., larger separation distance due to the device (261) that causes the arms to bend away from each other facilitated by the compliant elements (244, 254) of each of the arms).

Thus, by transitioning from the first state to the second state, a device disposed in the constrainer (239) may be positioned and/or oriented to enable mating between the device (261) and other devices (e.g., a protruding portion of a feedthrough (270)). To facilitate such positioning and/or orienting during and/or after mating, the constrainer (239) may be physically positioned and/or oriented.

FIG. 2.8 shows a fifth side view diagram of the constrainer (239) in accordance with one or more embodiments of the invention. The fifth side view diagram may be similar to that of the fourth side view diagram illustrated in FIG. 2.7 but includes attachment elements.

The attachment elements (272, 274) may be physical structures for positioning and/or orienting the constrainer (239) with respect to another device such as, for example, a protruding portion of a feedthrough (270). To position and/or orient the constrainer (239), the first attachment element (272) and/or the second attachment element (274) may physically attach corresponding portions of the constrainer (239) to predetermined locations. The predetermined locations may be, for example, on a portion of an internal volume boundary (273). By doing so, the constrainer (239) may be positioned and/or oriented.

The attachment elements (272, 274) may be any type of physical structure for facilitating the attachment of portions of the constrainer (239) to other predetermined locations without departing from the invention. For example, the attachment elements (272, 274) may be bolts, loops, bolts, screws, and/or any other type of physical structure (or types of physical structures) for attaching a portion of a device (e.g., a constrainer) to a predetermined location.

While the attachment elements (272, 274) are illustrated in FIG. 2.8 as attaching portions of the constrainer (239) to predetermined locations with respect to an internal volume boundary (273), the attachment elements may be used to attach the portions of the constrainer (239) to predetermined locations of other types of devices without departing from the invention.

FIGS. 2.9-2.10 show diagrams of a constrainer array in accordance with one or more embodiments of the invention. A constrainer array may be multiple constrainers arranged to facilitate disposition of multiple devices.

FIG. 2.9 shows a side view diagram of a constrainer array (280) in accordance with one or more embodiments of the invention. As noted above, the constrainer array (280) may be multiple constrainers disposed in a predetermined location to facilitate disposing multiple devices at the predetermined location.

For example, the constrainer array (280) may be a number of constrainers (e.g., 282) disposed on a tray (284). The tray (284) may be a physical device adapted to orient and/or position the constrainers (e.g., 282) of the constrainer array (280) when the tray (284) is disposed in a data processing device.

For example, the tray (284) may be a sheet-like structure having a shape complimentary to a portion of an internal volume of a data processing device. The complimentary shape of the tray may cause the constrainers to be positioned and/or oriented in a predetermined manner when the tray (284) is disposed in the internal volume at the portion of the internal volume. By doing so, the constrainers of the constrainer array (280) may be automatically positioned and/or oriented with respect to, for example, protruding portions of feedthroughs to facilitate operably connecting the devices disposed in the constrainers of the constrainer array (280) to other devices (e.g., power systems, communication systems, computing devices, remote devices, etc.).

The constrainer array (280) may be physically connected to the tray (284) via any method without departing from the invention.

FIG. 2.10 shows an isometric diagram of the constrainer array (280) in accordance with one or more embodiments of the invention. As seen in FIG. 2.10, the constrainer array (280) may facilitate densely disposing devices (286) in a predetermined area. Additionally, the constrainer array (280) may facilitate orienting of the devices to facilitate the formation of gas flow channels through the devices. As seen in FIG. 2.10, the orientation and positioning of the devices (286) enables paths for gasses to flow between the devices (286).

The constrainer array (280) of FIG. 2.10 may be used in conjunction with a data processing device. FIG. 2.11 shows a side view diagram of a data processing device that includes constrainers (288) in accordance with one or more embodiments of the invention. As seen from FIG. 2.11, the constrainers (288) may position and/or orient the devices (286) while the devices are disposed within the data processing device. Consequently, the devices may be operably connected to other devices with a reduced risk of damage caused by forming the operable connections via mechanical interconnection of the devices.

As discussed above, embodiments of the invention may be implemented using computing devices. FIG. 3 shows a diagram of a computing device in accordance with one or more embodiments of the invention. The computing device (300) may include one or more computer processors (302), non-persistent storage (304) (e.g., volatile memory, such as random access memory (RAM), cache memory), persistent storage (306) (e.g., a hard disk, an optical drive such as a compact disk (CD) drive or digital versatile disk (DVD) drive, a flash memory, etc.), a communication interface (312) (e.g., Bluetooth interface, infrared interface, network interface, optical interface, etc.), input devices (310), output devices (308), and numerous other elements (not shown) and functionalities. Each of these components is described below.

In one embodiment of the invention, the computer processor(s) (302) may be an integrated circuit for processing instructions. For example, the computer processor(s) may be one or more cores or micro-cores of a processor. The computing device (300) may also include one or more input devices (310), such as a touchscreen, keyboard, mouse, microphone, touchpad, electronic pen, or any other type of input device. Further, the communication interface (312) may include an integrated circuit for connecting the computing device (300) to a network (not shown) (e.g., a local area network (LAN), a wide area network (WAN) such as the Internet, mobile network, or any other type of network) and/or to another device, such as another computing device.

In one embodiment of the invention, the computing device (300) may include one or more output devices (308), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (302), non-persistent storage (304), and persistent storage (306). Many different types of computing devices exist, and the aforementioned input and output device(s) may take other forms.

Embodiments of the invention may provide a method, system, and device for managing electromagnetic interference. To manage electromagnetic interference, a data processing device in accordance with one or more embodiments of the invention may electromagnetically isolate one or more devices.

A data processing device in accordance with embodiments of the invention may provide communication services to the one or more devices that it electromagnetically isolates. To do so, the data processing device may provide an operable connection to the one or more devices via a mechanical link. To form the operable connection, the one or more devices may need to physically connect to the mechanical link.

The data processing device may include one or more constrainers. The constrainers may position and/or orient the one or more devices while and/or after forming the mechanical link. By positioning and/or orienting the one or more devices, the data processing device may reduce the probability of damage occurring during and/or after the mating.

Additionally, the constrainers may provide haptic, visual, and/or audio feedback to a user of the data processing device to indicate to the user that a mechanical link has been formed. The aforementioned feedback may be provided by a state transition by the constrainer to a state (e.g., a second state) associated with a high probability of a mechanical link between a device disposed in the constrainer and another device (e.g., protruding portion of a feedthrough) being formed. The aforementioned state may be mechanically stable and/or the transitioning to the state may provide the feedback to the user due to a physical state change of the constrainer (e.g., physical movement of portions of the constrainer).

Thus, embodiments of the invention may address the problem of electromagnetic interference within a high-density environment. Specifically, embodiments of the invention may provide a data processing device level solution that facilitates inclusion of a large number of electromagnetic interference emitting devices in a compact area while also positioning and/or orienting the aforementioned devices.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A constrainer, comprising:
   a base; and
   two arms mechanically coupled to the base,
   wherein the base and two arms are adapted to:
      while the constrainer is in a first state, receive a device; and
      while the constrainer is transitioning from the first state to a second state while the device is disposed in the constrainer, place the device in a predetermined orientation,
   wherein the base comprises:
      an aperture adapted to provide physical access to a portion of the device that is received by the base and two arms while the device is disposed in the constrainer, wherein the aperture is a through-hole, within a body of the base, that creates an opening through an entirety of the body of the base from a top surface of the base facing the device to a bottom surface of the base facing away from the device.

2. The constrainer of claim 1, wherein the base and two arms are further adapted to receive the device in a first orientation that is different from the predetermined orientation.

3. The constrainer of claim 2, wherein the predetermined orientation is with respect to the aperture.

4. The constrainer of claim 1, wherein transitioning from the first state to the second state, while the device is disposed in the constrainer, changes an orientation of the two arms with respect to the base.

5. The constrainer of claim 4, wherein transitioning from the first state to the second state, while the device is not disposed in the constrainer, changes an orientation of the two arms with respect to the base.

6. The constrainer of claim 1, wherein a separation distance between the arms is reduced as the base and two arms are transitioned from the first state to the second state.

7. The constrainer of claim 1, wherein the constrainer is mechanically stable while in the first state.

8. The constrainer of claim 7, wherein the constrainer is mechanically stable while in the second state.

9. The constrainer of claim 8, wherein the constrainer is mechanically unstable while transitioning from the first state to the second state.

10. The constrainer of claim 9, wherein the base and two arms are further adapted to return to the first state or the second state while mechanically unstable.

11. The constrainer of claim 1, wherein the two arms are mechanically coupled to the base by compliant elements that are adapted to allow the two arms to reorient with respect to the base when the constrainer transitions from the first state to the second state while the device is received by the constrainer.

12. The constrainer of claim 1, wherein the device is received by the base and two arms without any portion of the device entering the aperture.

13. A data processing device, comprising:
   an internal volume adapted to house a device;
   a feedthrough disposed at least partially in the internal volume, wherein the feedthrough is adapted to operably connect the device to other devices disposed outside of the internal volume; and
   a constrainer adapted to place the device in a predetermined orientation with respect to the feedthrough while the constrainer is moved from a first position that separates the device from the feedthrough to a second position that places the device in direct contact with the feedthrough,
   wherein the constrainer is a monolithic structure comprising a base disposed on a surface of the internal volume and two arms extending from a body of the base that holds the device in the second position,
   wherein the base of the constrainer comprises an aperture through which the feedthrough passes to be operably connected to the device, and
   wherein the aperture is a through-hole, within the body of the base of the constrainer, that creates an opening through an entirety of the body of the base from a top surface of the base facing the device to a bottom surface of the base facing away from the device.

14. The data processing device of claim 13, wherein the internal volume is adapted to electromagnetically isolate the device while the device is in the internal volume.

15. The data processing device of claim 14, wherein the electromagnetic isolation is by at least 90 decibels.

16. The data processing device of claim 13, wherein the predetermined orientation aligns a portion of the device with the feedthrough.

17. The data processing device of claim 16, wherein the constrainer is further adapted to:
   receive the device while the constrainer is in a first state that separates the device from the feedthrough;
   transition from the first state to a second state which places the portion of the device in contact with the feedthrough; and
   while transitioning from the first state to the second state, place the device in the predetermined orientation.

18. The data processing device of claim 17, wherein the constrainer is mechanically stable while in the first state and the second state.

19. The constrainer of claim 18, wherein the constrainer is mechanically unstable while transitioning from the first state to the second state.

20. The data processing device of claim 16, wherein the aligning of the portion of the device with the feedthrough enables mating of the portion of the device and the feedthrough.

* * * * *